United States Patent
Limberg

(10) Patent No.: US 8,441,581 B2
(45) Date of Patent: May 14, 2013

(54) SLOT-INTERLEAVED DECODING OF CONCATENATED CONVOLUTIONAL CODING IN MOBILE/HAND-HELD DIGITAL TELEVISION RECEIVERS

(76) Inventor: Allen LeRoy Limberg, Port Charlotte, FL (US)

(*) Notice: Subject to any disclaimer, the term of this patent is extended or adjusted under 35 U.S.C. 154(b) by 0 days.

(21) Appl. No.: 13/506,448

(22) Filed: Apr. 19, 2012

(65) Prior Publication Data

US 2012/0268659 A1 Oct. 25, 2012

Related U.S. Application Data

(60) Provisional application No. 61/517,757, filed on Apr. 25, 2011, provisional application No. 61/518,265, filed on May 3, 2011.

(51) Int. Cl.
*H04N 5/50* (2006.01)
*H03K 9/00* (2006.01)

(52) U.S. Cl.
USPC ............................... 348/731; 375/316

(58) Field of Classification Search ............ 375/316; 348/731, 725
See application file for complete search history.

(56) References Cited

U.S. PATENT DOCUMENTS

2010/0100793 A1* 4/2010 Limberg ................. 714/756

* cited by examiner

*Primary Examiner* — Daniel Washburn
*Assistant Examiner* — Brian J Stevens

(57) ABSTRACT

At least two turbo decoding apparatuses are used in a receiver for concatenated convolutional coding transmissions imbedded in 8-VSB digital television signals. This permits turbo decoding procedures for the M/H Groups in any Parade consisting of eight or fewer M/H Groups to be interleaved so at least one M/H Slot interval after each of those M/H Groups has been received is available for decoding that M/H Group.

9 Claims, 12 Drawing Sheets

Fig. 1 M/H Group Assignment Order in an M/H Sub-Frame

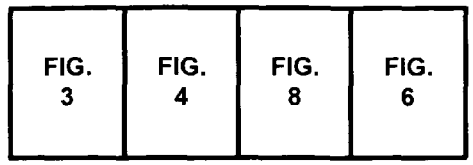
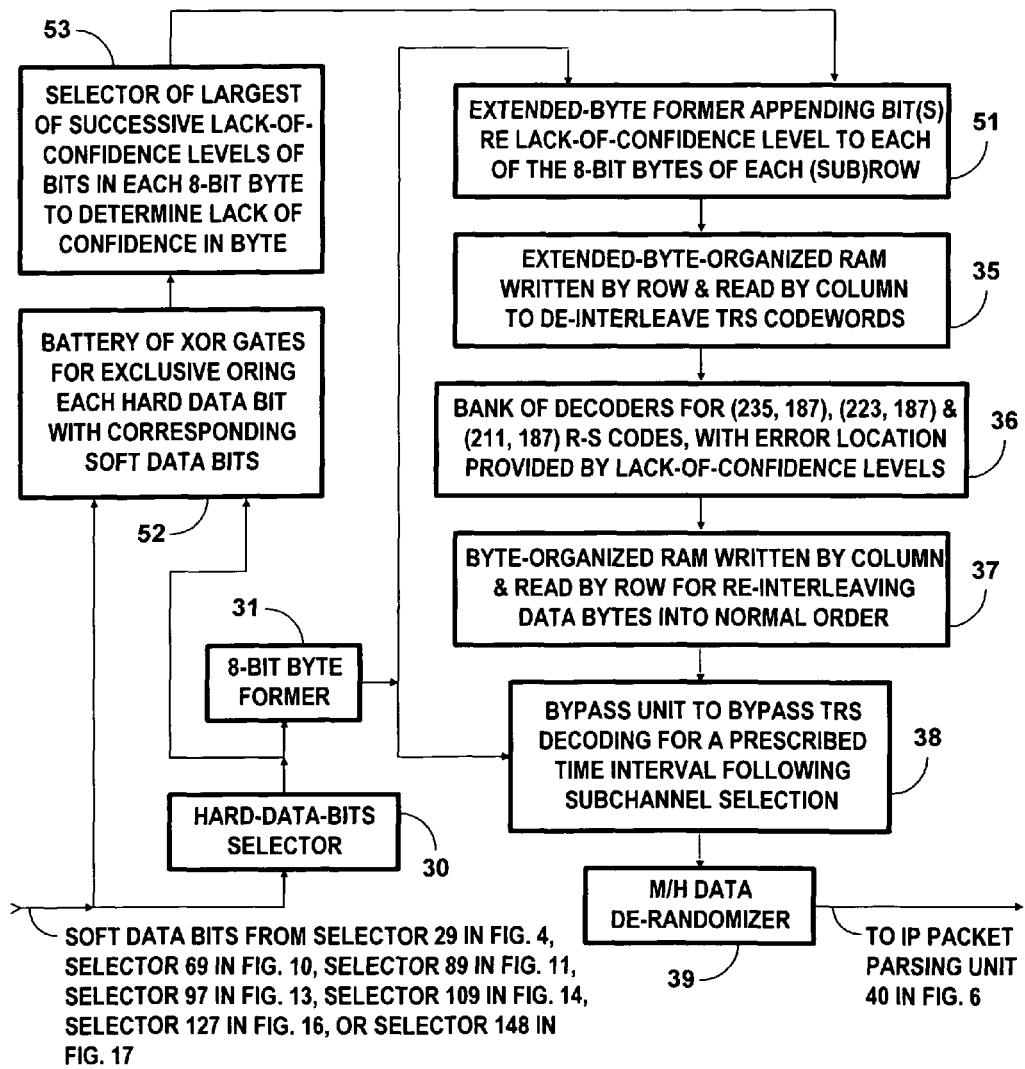
Fig. 8

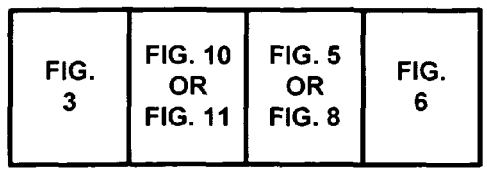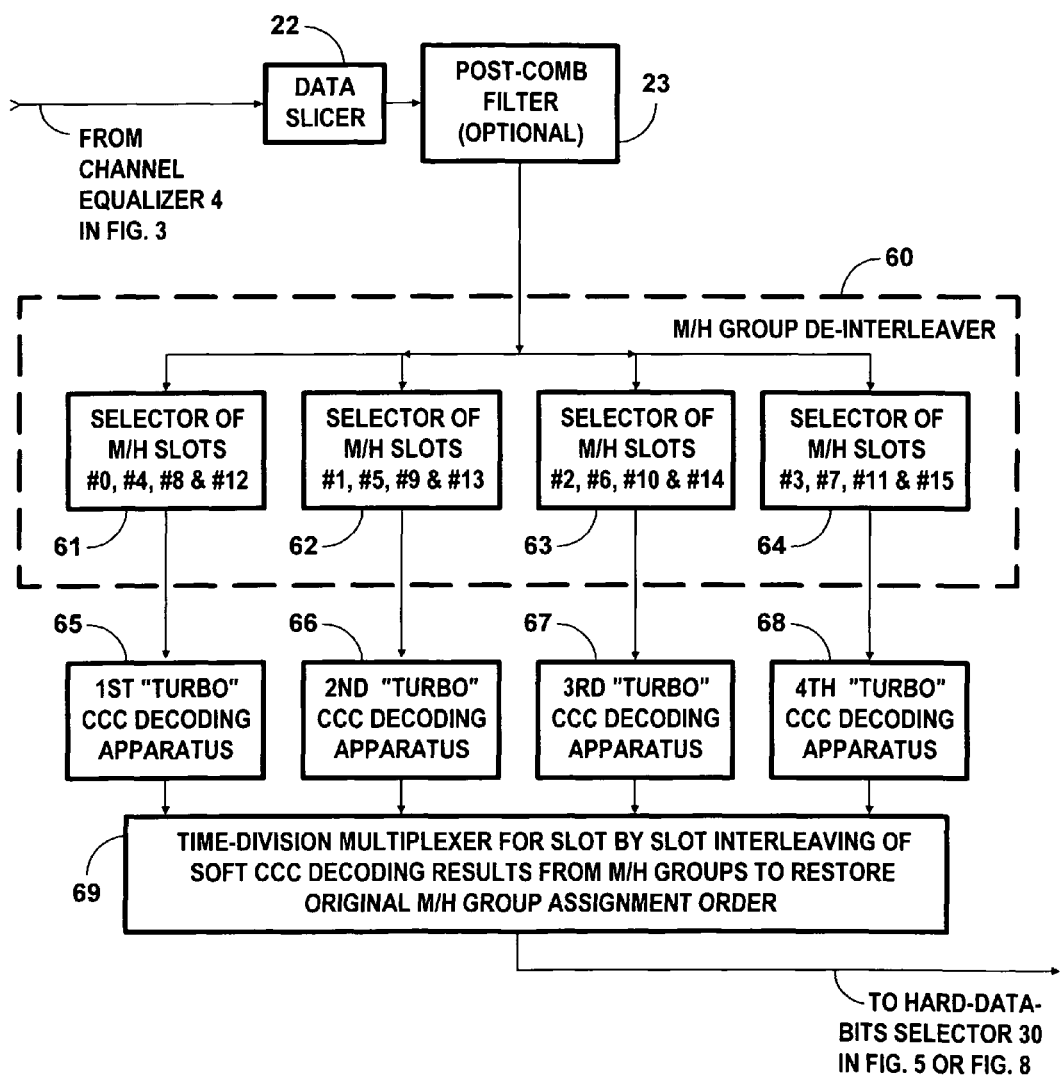

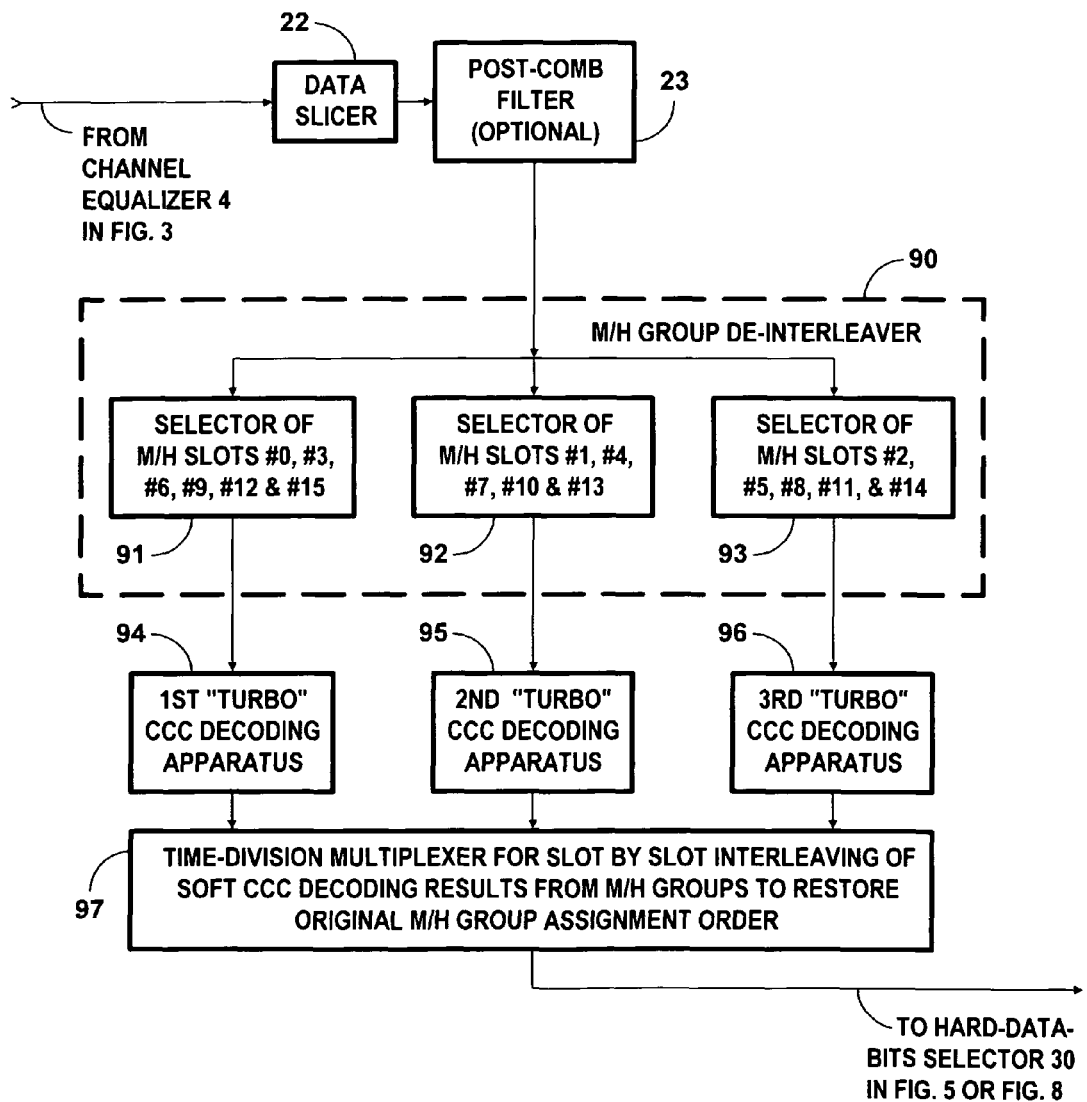

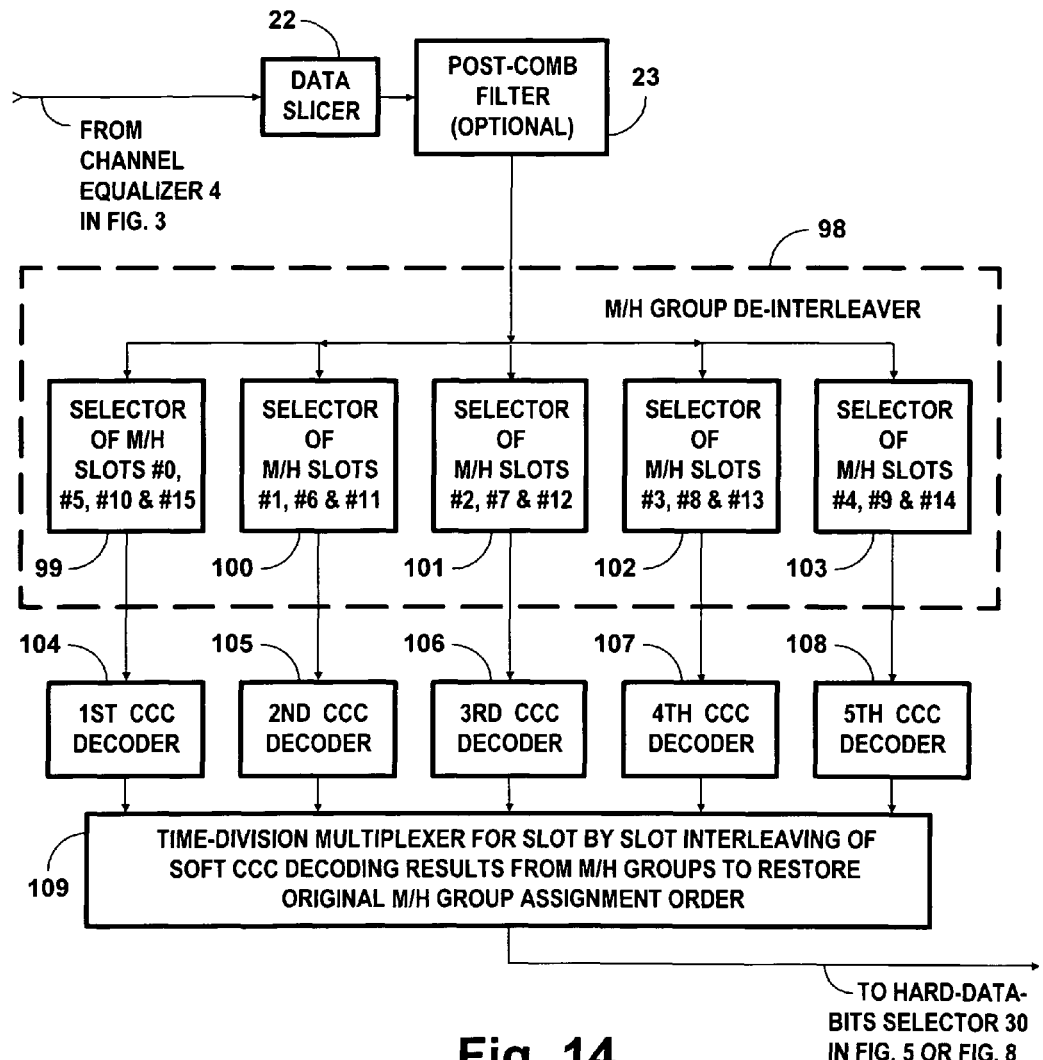
Fig. 14
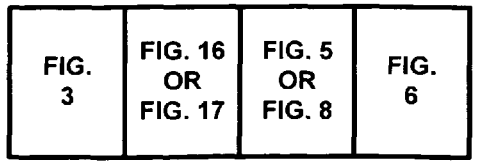

SLOT-INTERLEAVED DECODING OF CONCATENATED CONVOLUTIONAL CODING IN MOBILE/HAND-HELD DIGITAL TELEVISION RECEIVERS

This application claims priority from U.S. Provisional Applications Ser. Nos. 61/517,757 and 61/518,265 filed on Apr. 25, 2011 and on May 3, 2011, respectively.

FIELD OF THE INVENTION

The invention relates to mobile and hand-held receivers for digital television (DTV) signals broadcast over the air, commonly referred to collectively as "M/H" receivers.

BACKGROUND OF THE INVENTION

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is of particular relevance to this specification, defining many of the terms employed herein. In the beginning years of the twenty-first century, efforts were made to provide for more robust transmission of data over broadcast DTV channels without unduly disrupting the operation of so-called "legacy" DTV receivers already in the field. These efforts culminated in an ATSC standard directed to broadcasting data to mobile receivers being adopted on 15 Oct. 2009. This standard, referred to as "A/153", is also relevant to this specification, defining many of the terms employed herein. The data for concatenated convolutional coding (CCC) are commonly referred to as "M/H data" in reference to the mobile and handheld receivers that will receive such data.

Both A/53 and A/153 are directed to 8-VSB signals being used in DTV broadcasting. A radio-frequency (RF) 8-VSB signal is transmitted by vestigial-sideband amplitude modulation of a single carrier wave in accordance with an 8-level modulating signal that encodes 3-bit symbols descriptive of 2-bit symbols of the digital data to be transmitted. The three bits in the 3-bit symbols are referred to as Z-sub-2, Z-sub-1 and Z-sub-0 bits. The initial and final bits of each successive 2-bit symbol of the digital information are referred to as an X-sub-2 bit and as an X-sub-1 bit, respectively. The X-sub-2 bits are subjected to interference-filter pre-coding to generate the Z-sub-2 bits, which Z-sub-2 bits can be post-comb filtered in a DTV receiver to recover the X-sub-2 bits. The Z-sub-1 bits correspond to the X-sub-1 bits. The Z-sub-0 bits are redundant bits resulting from one-half-rate convolutional coding of successive X-sub-1 bits to provide two-thirds-rate trellis coding as prescribed by A/53.

A/153 prescribes serial concatenated convolutional coding (SCCC) of data transmitted to mobile receivers, which SCCC uses one-half-rate outer convolutional coding of such data followed by symbol-interleaving and two-thirds-rate trellis coding similar to that prescribed by A/53. The one-half-rate convolutional coding incorporated within the two-thirds-rate trellis coding serves as one-half-rate inner convolutional coding in the SCCC. A/153 further prescribes additional forward-error-correction coding of the data transmitted to mobile receivers, which additional FEC coding comprises transverse Reed-Solomon (TRS) coding combined with lateral cyclic-redundancy-check (CRC) codes which a receiver can use to locate byte errors for the TRS coding. The principal design task for the transverse Reed-Solomon (TRS) coding used in the RS Frames prescribed by A/153 is overcoming drop-outs in received strength caused by reception nulls when the receiver is moved through an electromagnetic field subject to multipath signal propagation. The strongest TRS codes prescribed by A/153 can overcome momentary drop-outs in received signal strength that are as long as four tenths of a second. Furthermore, the shortened 255-byte Reed-Solomon (RS) codes used for TRS coding are very powerful codes for correcting shorter burst errors, especially when used together with codes for locating byte-errors.

A/153 prescribes that the M/H-service information be subjected to outer convolutional coding and symbol interleaving before encapsulation in 188-byte transport-stream (TS) packets called "MHE packets" that are subjected to non-systematic (207, 187) Reed-Solomon coding to generate selected segments of 8-VSB data fields. These segments of 8-VSB data fields are time-division multiplexed with other segments generated by systematic (207, 187) Reed-Solomon coding of 188-byte TS packets of main-service information. The bytes of the resulting 8-VSB data fields are convolutionally interleaved before being subjected to the 2/3 trellis coding that functions as inner convolutional coding of the SCCC used for transmissions to M/H receivers. All the segments of 8-VSB data fields have (207, 187) Reed-Solomon coding to insure that DTV receivers already in the field continue to receive main-service information usefully. Some of those "legacy" DTV receivers might otherwise place themselves in a "sleeping" mode if their decoders for (207, 187) R-S coding find too many of the segments of 8-VSB data fields to contain byte errors that cannot be corrected.

The SCCC used for transmissions to M/H receivers appear in sixteen successive M/H Slots in each of five sub-frames of M/H Frames, which M/H Frames span twenty 8-VSB data frames—i.e., forty 8-VSB data fields. The data occupying an M/H Slot are referred to as an M/H Group. The allocation and assignment of M/H Groups in an M/H Frame is illustrated in FIG. 1 of the drawings. The number of M/H Groups allotted per M/H Frame is a multiple of five, and the Group allotment and assignment are identical for all M/H Sub-Frames in an M/H Frame.

Before convolutional byte interleaving of 8-VSB data fields, an M/H Slot consists of 156 data segments of 8-VSB signal. An M/H Slot may convey just 156 legacy transport-stream (TS) packets, or may be assigned to convey a Group of 118 M/H-carrying MHE packets plus 38 legacy TS packets. The lower row of FIG. 1 illustrates the order in which M/H Groups are assigned to M/H Slots within each M/H sub-Frame as the amount of M/H data increases. Once the assignment is made, however, the M/H data are transmitted in time order of available M/H Slots. For example, if there are 3 M/H Groups per M/H Sub-Frame, then the first Slot (Slot #0), the 5th Slot (Slot #4) and the 9th Slot (Slot #8) will be allocated in each M/H Sub-Frame, shown as Group assignment order numbers 0, 1, and 2. The assignments begin with one-of-four spacing until those possibilities are exhausted, then go to one-of-two, and so on.

An M/H Parade is a collection of related M/H Groups contained within one M/H Frame. An M/H Parade conveys data from one or two particular RS Frames depending on an RS Frame mode. The RS Frame is temporarily stored in a packet-level memory that supports error-correction decoding of the M/H data as transmitted with transverse Reed-Solomon (TRS) coding combined with lateral CRC codes. Each RS Frame carries, and FEC encodes, an M/H Ensemble, which is a collection of M/H services providing the same quality of service (QoS).

The portion of a Parade within a Sub-Frame consists of a collection of consecutively numbered M/H Groups. The structure of a Parade in terms of its constituent Group numbers and Slot numbers within a Sub-Frame is replicated in all Sub-Frames of an M/H Frame, although the data contents of the Groups differ in successive ones of the Sub-Frames. The beginning Group number for the first Parade to which Group numbers are assigned shall be zero. The beginning Group number of a succeeding Parade shall be the next higher Group number after the Group numbers for all preceding Parades have been assigned. The Number of Groups per M/H Sub-Frame (NoG) for an M/H Parade is allowed to range from 1 to 8. Therefore the number of Groups per an M/H Frame for a Parade ranges from 5 to 40 in steps of 5.

In March 2011 Roy Oren of Siano Mobile Silicon reported to ATSC that turbo decoding of a Parade with five Groups per Sub-Frame of an M/H Frame was problematic, if the first of the five numbered Groups in each Sub-Frame were located in Slot #2 thereof. The last of the five Groups in each Sub-Frame would then be located in Slot #1 thereof. Since the M/H Group 8 in Slot #1 was immediately succeeded by the M/H Group 4 in Slot #2, the decoder for the M/H-service SCCC had too little time to carry out iterative decoding procedures on M/H Group 8 fully before M/H Group 4 was received. These iterative decoding procedures are commonly referred to as "turbo decoding" procedures, irrespective of whether the concatenated convolutional coding (CCC) is the type known as "serial concatenated convolutional coding" (SCCC) or an earlier-known other type known as "parallel concatenated convolutional coding" (PCCC). A. L. R. Limberg subsequently reported that a condition of too little time to carry out iterative decoding procedures fully would obtain whenever a Parade composed of more than four Groups per Sub-Frame of an M/H Frame was located so as to include M/H Groups #7 and #8 in each Sub-Frame.

Decoding CCC using a plurality of time-interleaved decoders has been known per se for some time in the prior art. For example, such decoding is described in U.S. Pat. No. 7,827,473 issued 2 Nov. 2010 to Tak K. Lee and Ba-Zhong Shen, titled "Turbo decoder employing ARP (almost regular permutation) interleave and arbitrary number of decoding processors" and assigned to Broadcom Corporation. The general thrust of the prior art is the use of interleaved separate concatenated convolutional coding systems to overcome burst noise. Accordingly, the extent of interleaving in the prior art tends to be smaller or at least no larger than the fields of data being processed. This permits a receiver to use a reasonably small amount of memory to implement de-interleaving during decoding.

The amount of memory that an M/H receiver employs for temporarily storing RS Frames of data recovered as turbo decoding results from an M/H Frame is very large, large enough to store the data packets recovered from five M/H Groups or a multiple up to eight thereof. The data recovered as turbo decoding results from respective ones of the Groups are successively written M/H Group by M/H Group on a time-interleaved basis into the memory for temporarily storing the RS Frame.

SUMMARY OF THE INVENTION

The respective turbo decoding procedures for the M/H Groups in a Parade are interleaved in time so as to always permit at least one M/H Slot interval after each of those M/H Groups has been received for decoding that M/H Group. At least two turbo decoding apparatuses are required to insure that this can be done for all Parades consisting of eight or fewer M/H Groups. Some embodiments of the invention use a first CCC decoder for turbo decoding M/H Groups located in even-numbered M/H Slots #0, #2, #4, #6, #8, #10, #12 and #14. These embodiments of the invention use a second CCC decoder for turbo decoding odd-numbered M/H Groups located in M/H Slots #1, #3, #5, #7, #9, #11, #13 and #15. The turbo decoding of the M/H Groups located in M/H Slots #1, #3, #5, #7, #9, #11, #13 and #15 is performed on a staggered-in-time basis with the turbo decoding of the M/H Groups located in M/H Slots #0, #2, #4, #6, #8, #10, #12 and #14. Bytes of the data resulting from such turbo decoding are written to rows of byte-storage locations in memory for each RS Frame. The addressing during such writing is such as to restore M/H Groups of data to their assigned order as indicated in FIG. 1 of the drawings before transverse Reed-Solomon (TRS) decoding procedures are performed. The bytes of data in the RS Frame are read column by column to Reed-Solomon decoder circuitry to be forward-error-corrected by the TRS decoding procedures. The error-corrected bytes are written column by column into memory for the RS Frame, either being written into further memory for the RS Frame or being written back into the memory for the RS Frame from which they were read. The error-corrected data bytes are then read row by row from that memory to be parsed into the data packets of a reproduced transport stream.

Other embodiments of the invention make nearly three M/H Slot intervals available in which to complete the turbo decoding of each M/H Group, but require four CCC decoders rather than just two. These further embodiments of the invention use a first CCC decoder for turbo decoding M/H Groups located in M/H Slots #0, #4, #8 and #12. These further embodiments of the invention use a second CCC decoder for turbo decoding M/H Groups located in M/H Slots #1, #5, #9 and #13. These further embodiments of the invention use a third CCC decoder for turbo decoding M/H Groups located in M/H Slots #2, #6, #10 and #14. These further embodiments of the invention use a fourth CCC decoder for turbo decoding M/H Groups located in M/H Slots #3, #7, #11 and #15. Bytes of the data resulting from such turbo decoding are written to rows of byte-storage locations in memory for each RS Frame. The addressing during such writing is such as to restore packets of the data to their assigned order as indicated in FIG. 1 of the drawings before transverse Reed-Solomon (TRS) decoding procedures are performed. Further processing can then proceed similarly to what is described in the previous paragraph.

Still other embodiments of the invention make nearly fifteen M/H Slot intervals available in which to complete the turbo decoding of each M/H Group, but require eight CCC decoders performing differently phased turbo decoding. Each of the eight CCC decoders performs turbo decoding of M/H Groups in a particular pair of the assigned M/H Slots in each M/H sub-Frame. Yet other embodiments of the invention use sixteen CCC decoders, each performing turbo decoding of M/H Groups in a particular assigned M/H Slot in each M/H sub-Frame.

BRIEF DESCRIPTION OF THE DRAWINGS

FIG. 7 is an assembly drawing that shows how FIGS. 3, 4, 8 and 6 combine to provide a schematic diagram of alternative receiver apparatus for receiving M/H transmissions sent over the air, which receiver apparatus embodies the invention by employing two CCC decoders for turbo decoding.

FIG. 8 is a block schematic drawing of the portion of the FIG. 7 M/H receiver apparatus for decoding TRS codewords using the results of turbo decoding to locate byte errors for TRS decoding, and for de-randomizing the TRS decoding results to recover a transport stream of MPEG-2 data packets.

FIG. 9 is an assembly drawing that shows how FIG. 3, FIG. 10 or 11, FIG. 5 or 8, and FIG. 6 combine to provide schematic diagrams of receiver apparatuses for receiving M/H transmissions sent over the air, which receiver apparatuses each embody the invention and employ more than two CCC decoders for turbo decoding.

FIG. 10 is a block schematic drawing of the portion of an M/H receiver apparatus per FIG. 9 that employs four CCC decoders for turbo decoding.

FIG. 12 is an assembly drawing that shows how FIG. 3, FIG. 13 or 14, FIG. 5 or 8, and FIG. 6 combine to provide schematic diagrams of receiver apparatuses for receiving M/H transmissions sent over the air, which receiver apparatuses each embody the invention and employ more than two CCC decoders for turbo decoding.

FIG. 13 is a block schematic drawing of the portion of an M/H receiver apparatus per FIG. 12 that employs three CCC decoders for turbo decoding.

FIG. 14 is a block schematic drawing of the portion of an M/H receiver apparatus per FIG. 12 that employs five CCC decoders for turbo decoding.

FIG. 15 is an assembly drawing that shows how FIG. 3, FIG. 16 or 17, FIG. 5 or 8, and FIG. 6 combine to provide schematic diagrams of receiver apparatuses for receiving M/H transmissions sent over the air, which receiver apparatuses each embody the invention and employ more than two CCC decoders for turbo decoding.

DETAILED DESCRIPTION

Figure 1:
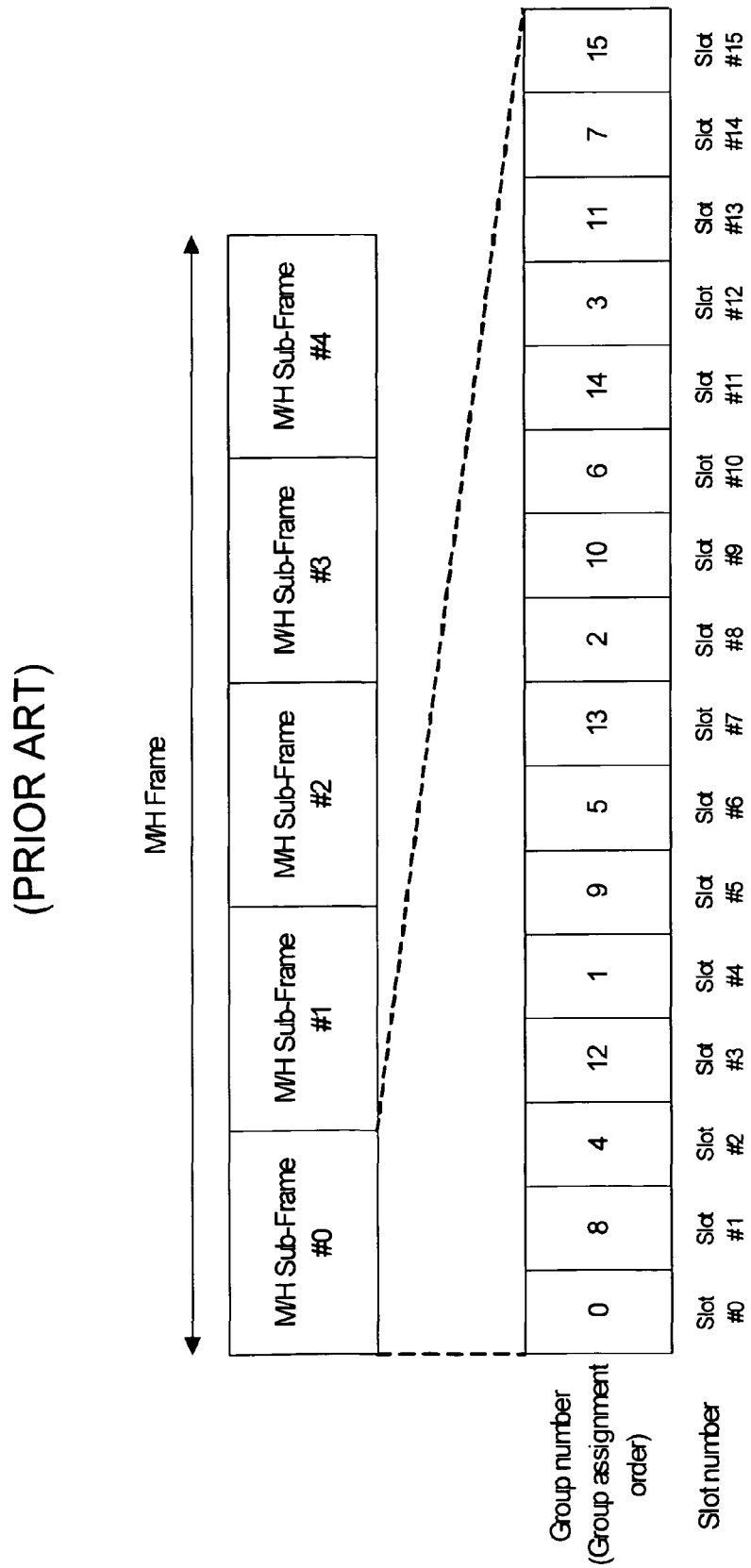
FIG. 1 is a diagram showing the order in which sixteen M/H Groups with assigned identification numbers 0, 8, 4, 12, 1, 9, 5, 13, 2, 10, 6, 14, 3, 11, 7 and 15 are arranged in M/H Slots #0, #1, #2, #3, #4, #5, #6, #7, #8, #9, #10, #11, #12, #13, #14 and #15 of a representative sub-frame #0 of the five sub-frames #0, #1, #2, #3 and #4 of an M/H Frame.

FIG. 1 is copied from a diagram included in Part 2 of the ATSC Mobile DTV Standard, titled "Transmission System Characteristics". FIG. 1 shows the order in which sixteen M/H Groups are arranged in M/H Slots #0, #1, #2, #3, #4, #5, #6, #7, #8, #9, #10, #11, #12, #13, #14 and #15, respectively, of a sub-frame #0 of an M/H Frame. The M/H Groups are assigned consecutive numbers 0 through 15 in accordance with the temporal order in which the data they respectively encode was presented for concatenated convolutional coding at the transmitter. M/H Groups with assigned identification numbers 0, 8, 4, 12, 1, 9, 5, 13, 2, 10, 6, 14, 3, 11, 7 and 15 are disposed in sixteen successive M/H Slots of sub-frame #0, respectively. This is representative of the disposition of M/H Groups in sixteen successive M/H Slots of each of the four other sub-frames #1, #2, #3 and #4 of the M/H Frame. Each M/H Parade is composed of a number, no more than eight, of consecutively numbered M/H Groups in each of the five successive sub-frames of an M/H Frame.

Figure 2:
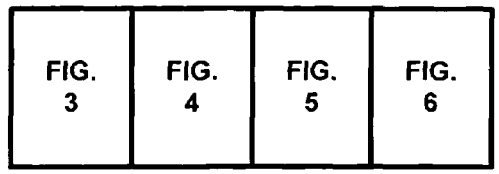
FIG. 2 is an assembly drawing that shows how FIGS. 3, 4, 5 and 6 combine to provide a schematic diagram of M/H receiver apparatus for receiving M/H transmissions sent over the air in accordance with A/153, which receiver apparatus embodies the invention by employing two CCC decoders for turbo decoding.

FIG. 2 is an assembly drawing that shows how FIGS. 3, 4, 5 and 6 combine to provide a detailed schematic diagram of DTV receiver apparatus for receiving M/H transmissions sent over the air in accordance with A/153. The FIG. 3 portion of DTV receiver apparatus includes a vestigial-sideband amplitude-modulation (VSB AM) DTV receiver front-end 1 for selecting a radio-frequency DTV signal for reception, converting the selected RF DTV signal to an intermediate-frequency DTV signal, and for amplifying the IF DTV signal. An analog-to-digital converter 2 is connected for digitizing the amplified IF DTV signal supplied from the DTV receiver front-end 1. A demodulator 3 is connected for demodulating the digitized VSB AM IF DTV signal to generate a digitized baseband DTV signal. The receiver front-end 1, the ADC converter 2, and the VSB AM demodulator 3 combine to provide conversion apparatus for receiving a selected 8VSB signal as transmitted in 8VSB modulation of a radio-frequency carrier wave within a respective frequency channel and converting it to digital samples of a baseband signal. (Equivalent circuitry that digitizes baseband signal after analog demodulation of VSB AM signal is used in alternative embodiments of the DTV receiver apparatus.) The VSB AM demodulator 3 is connected to supply digital samples of a baseband signal to an adaptive channel-equalizer 4 for equalization of channel response. Alternative arrangements for equalization of channel response that perform a portion of channel equalization at IF are also known in the prior art. Synchronization signals extraction circuitry 5 is connected for receiving the response of the adaptive channel-equalizer 4. Responsive to data-field-synchronization (DFS) signals, the sync extraction circuitry 5 detects the beginnings of data frames and fields. Responsive to data-segment-synchronization (DSS) signals, the sync extraction circuitry 5 detects the beginnings of data segments. The FIG. 1 DTV receiver apparatus uses the DSS and DFS signals for controlling its operations similarly to the way this is customarily done in DTV receivers. None of FIGS. 3, 4, 5 and 6 explicitly shows the circuitry for effecting these operations.

A decoder 6 for detecting the type of ancillary transmission responds to 8-bit sequences contained in final portions of the reserved portions of DFS signals separated by the sync extraction circuitry 5. The decoder 6 is connected for indicating the type of ancillary transmission to a decoding control unit 7 that controls turbo decoding of CCC and plural-dimensional decoding of RS Frames in the FIG. 1 DTV receiver apparatus. The type of ancillary transmission that the decoder 6 detects may be one that conditions the decoder 6 to extract further information concerning the ancillary transmission from the initial portions of the reserved portions of DFS signals separated by the sync extraction circuitry 5. The decoder 6 is connected for supplying such further information to the decoding control unit 7, which controls turbo decoding of CCC and the plural-dimensional decoding of RS Frames. Most of the connections of the decoding control unit 7 to the elements involved in these decoding procedures are not explicitly shown in FIGS. 3, 4 and 5, so as to keep those figures from being too cluttered to be understood readily.

Figure 3:
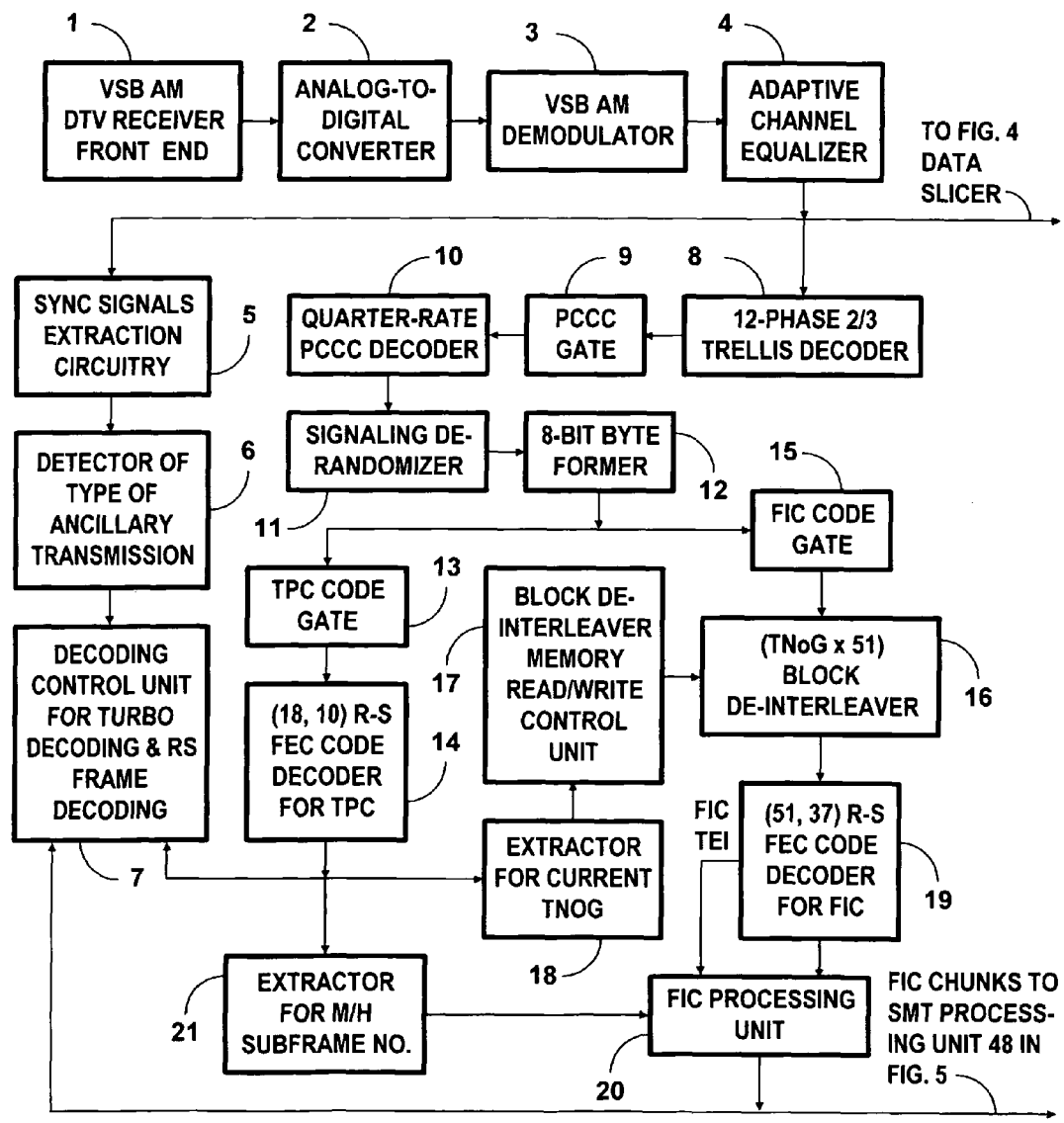
FIG. 3 is a block schematic diagram of the portions of the M/H receiver apparatus to recover baseband digital television signal, transmission parameter channel (TPC) signal and fast information channel (FIC) signal.

FIG. 3 shows a 12-phase trellis decoder 8 connected for receiving the response of the channel equalizer 4. The 12-phase trellis decoder 8 is connected for supplying trellis-decoding results to a PCCC gate 9 connected for extracting the PCCC'd signaling within each Group and reproducing the PCCC'd signaling for application as input signal to a decoder 10 for quarter-rate PCCC. The decoder 10 reproduces randomized signaling decoded (possibly with some errors) from the quarter-rate PCCC supplied thereto and is connected for supplying that randomized signaling as input signal to a signaling de-randomizer 11. The signaling de-randomizer 11 is connected for supplying de-randomized signaling to an 8-bit byte former 12. A TPC code gate 13 is connected for extracting bytes of TPC code from bytes of the de-randomized signaling supplied by the byte former 12 and supplying those extracted bytes of TPC code as input signal to a decoder 14 for (18, 10) Reed-Solomon coding. The decoder 14 recovers TPC information and is connected for supplying the TPC information to the decoding control unit 7 and to other elements of the receiver apparatus. The decoding control unit 7 is able to respond to the TPC information to control selection of the type of outer convolutional decoding to be used on CCC portions of each M/H Group.

FIG. 3 shows an FIC code gate 15 connected for extracting byte-interleaved FIC code bytes from the bytes of de-randomized signaling supplied by the byte former 12 and reproducing those extracted bytes for application as input signal to a block de-interleaver 16. The block de-interleaver 16 is of matrix type and complements the block interleaving done at the transmitter, as prescribed in A/153. In this specification (over)writing refers both to memory writing procedures in which storage locations are empty of content when written by new content and to memory writing procedures in which storage locations have their original contents overwritten by new content. The block de-interleaver 16 is essentially a byte-organized random access memory (RAM) with byte-storage locations arrayed in rows and columns to be (over) written and read in accordance with addressing and read/write control signals supplied from a block de-interleaver memory read/write control unit 17. The byte-storage locations are arrayed in 51-byte rows for being (over)written by RS-coded FIC data from respective Groups within each M/H Sub-Frame. The memory read/write control unit 17 needs to know the total number of Groups, TNoG, within each M/H Sub-Frame in order to know the number of these 51-byte rows. The memory read/write control unit 17 uses this knowledge to control the addressing of successive columns of TNoG byte-storage locations when writing to them. An extractor 18 is connected to extract TNoG for the current M/H Sub-Frame (current_TNoG) from the response of the decoder 14 of the (18, 10) Reed-Solomon coded TPC data. The value of current_TNoG appears NoG times in the TPC data recovered by the decoder 14 from the previous M/H Sub-Frame. The extractor 18 selects from the TPC data those bit sequences descriptive of current_TNoG estimates and decides the value of current_TNoG based on the majority of concurring estimates. The extractor 18 is connected to supply that value of current_TNoG to the memory read/write control unit 17.

After the final Group of each M/H Sub-Frame concludes, the memory read/write control unit 17 generates read addresses for reading rows of 35×TNoG bytes from the RAM in the block de-interleaver 16. The reading is completed before the initial Group of the next M/H Sub-Frame begins and the contents of the memory in the block de-interleaver 16 will be (over)written. The block de-interleaver 16 is connected for supplying its de-interleaved FIC code response as input signal to a decoder 19 for (51, 37) Reed-Solomon coding. The decoder 19 recovers FIC information and is connected for supplying that FIC information to an FIC processing unit 20 together with a respective FIC Transport Error Indication (TEI) bit concerning each (51, 37) Reed-Solomon codeword. The FIC TEI bit generated by the decoder 19 is a ONE whenever byte error that cannot be corrected is detected within a (51, 37) Reed-Solomon codeword, but is a ZERO if such byte error is not detected. E.g., an FIC TEI bit is likely to be generated if there is a momentary fade in received RF signal strength.

An extractor 21 extracts the current M/H Sub-Frame number from the response of the decoder 14 of the (18, 10) Reed-Solomon coded TPC data and supplies that M/H Sub-Frame number to the FIC-Chunk processing unit 20. The current M/H Sub-Frame number appears NoG times in the TPC data recovered by the decoder 14 from the current M/H Sub-Frame. The extractor 21 selects from the TPC data those bit sequences descriptive of current M/H sub-Frame number estimates and decides the value of current M/H Sub-Frame number based on the majority of concurring estimates. The current M/H Sub-Frame number aids the FIC-Chunk processing unit 20 in its parsing of FIC Chunks, particularly the extended FIC Chunks, that the decoder 19 for (51, 37) Reed-Solomon coding supplies. The FIC-Chunk processing unit 20 is connected for supplying processed FIC Chunks to the decoding control unit 7. (FIG. 3 indicates that processed FIC Chunks from the FIC-Chunk processing unit 20 are supplied to an SMT-MH processing unit 48 shown in FIG. 6, where they are integrated with SMT-MH information during the generation of Service Map Data written to a memory 49 for temporary storage therewithin.)

Figure 4:
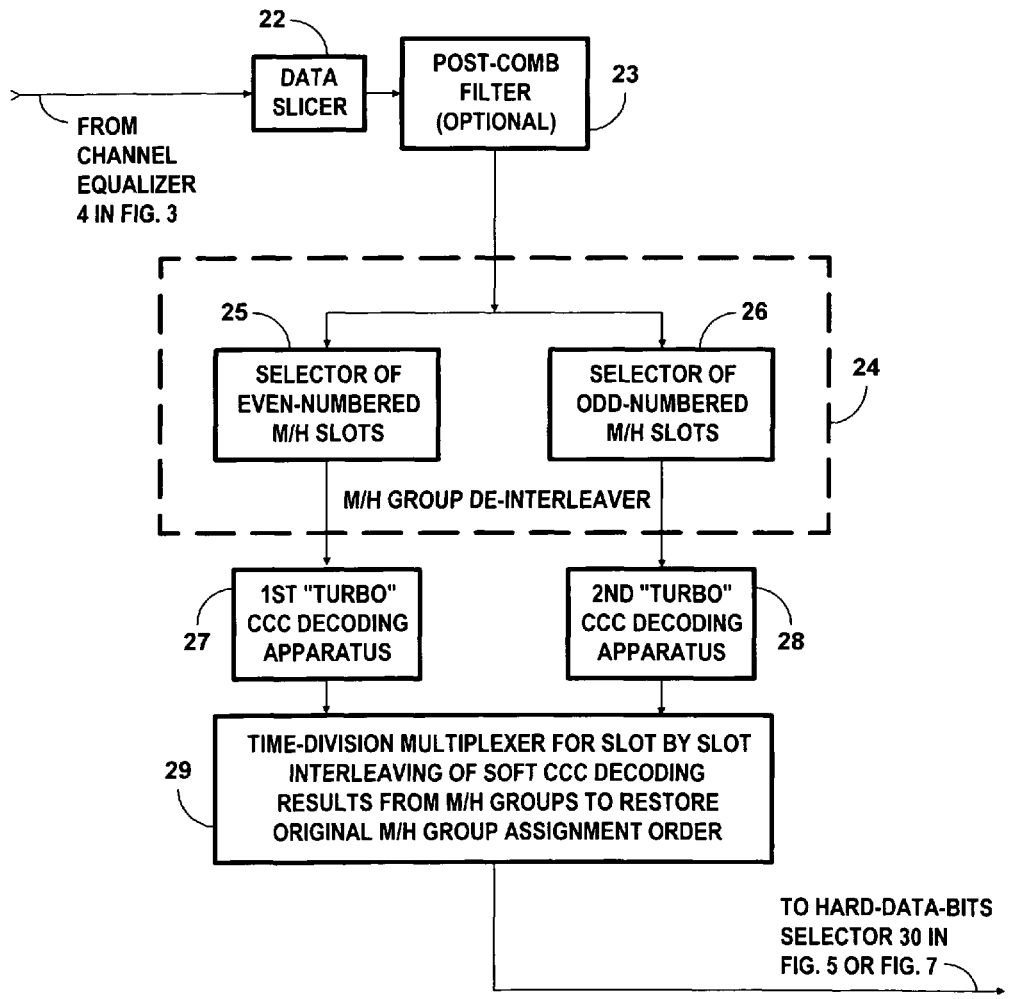
FIG. 4 is a block schematic diagram of the portion of the M/H receiver apparatus for turbo decoding baseband digital television signal to recover portions of transverse Reed-Solomon (TRS) codewords, which FIG. 4 portion of the M/H receiver apparatus in accordance with an aspect of the invention comprises two CCC decoders for turbo decoding.

FIG. 4 shows the turbo decoding circuitry for CCC transmissions of M/H-service data at one-half, one third or one-quarter the code rate of the 2/3 trellis coding of ordinary 8-VSB DTV data. The adaptive channel-equalizer 4 in FIG. 3 is connected to supply its response at Nyquist rate to the input port of a data slicer 22 in FIG. 4. The data slicer 22 is operable to supply soft data bits responsive to the channel-equalizer 4 response that the data slicer 22 receives as input signal thereto. The data slicer 22 is connected to supply these soft data bits to a post-comb filter 23 that is used when receiving 8-VSB DTV signals as prescribed by A/153. The output port of the post-comb filter 23 is connected for supplying its response to the input port of an M/H Group de-interleaver 24. However, if the CCC used for M/H-service transmissions does not employ interference-filter pre-coding of the most significant bits of the 3-bit sequences used to define 8-VSB symbols, the post-comb filter 23 is not used. Instead, there is a direct connection from the output port of the data slicer 22 to the input port of the M/H Group de-interleaver 24.

FIG. 4 shows the M/H Group de-interleaver 24 to be composed of a first selector 25 and a second selector 26 having respective input ports connected from the input port of the de-interleaver 24. The first selector 25 is operable for selecting M/H Groups in even-numbered M/H Slots #0, #2, #4, #6, #8, #10, #12 and #14 to be supplied from a first output port of the M/H Group de-interleaver 24 to the input port of first CCC decoding apparatus 27. The second selector 26 is operable for selecting M/H Groups in odd-numbered M/H Slots #1, #3, #5, #7, #9, #11, #13 and #15 to be supplied from a second output port of the M/H Group de-interleaver 24 to the input port of second CCC decoding apparatus 28. If the M/H transmissions are SCCC transmissions as prescribed by A/153, the CCC decoding apparatuses 27 and 28 are each of a type for decoding SCCC at one-half or one-quarter the code rate of 8-VSB. If the CCC decoding apparatuses 27 and 28 do not commence decoding each M/H Group until it has been fully received, each of them will have a respective M/H Slot interval in which to perform turbo decoding procedures on each M/H Group. Each of the CCC decoding apparatuses 27 and 28 may be constructed from a number of component CCC decoders that further de-interleave each M/H Group for substantially parallel CCC decoding procedures. Each of such component CCC decoders will have nearly two full M/H Slot intervals in which to perform turbo decoding procedures on each M/H Group.

FIG. 4 shows a time-division multiplexer 29 having a first input port to which the output port of the first CCC decoding apparatus 27 connects and having a second input port to which the output port of the second CCC decoding apparatus 28 connects. The time-division multiplexer 29 is operable for interleaving the soft decoding results from the first CCC decoding apparatus 27 and the second CCC decoding apparatus 28, M/H Group by M/H Group. The interleaving is done so to restore the combined soft decoding results to the original Slot order in which the M/H Groups were received. That is, the order of the soft decoding results from M/H Groups that the time-division multiplexer 29 is operable to supply from its output port conforms to the M/H Group Assignment Order in M/H sub-Frames shown in FIG. 1. This is the M/H Group Assignment Order prescribed by A/153. That is, the time-division multiplexer 29 is operable for sequentially supplying turbo decoding results for M/H Groups 0, 8, 4, 12, 1, 9, 5, 13, 2, 10, 6, 14, 3, 11, 7 and 15. These Groups will subsequently placed into 0, 1, 2, 3, 4, 5, 6, 7, 8, 9, 10, 11, 12, 13, 14 and 15 order during the writing of framestore memory for RS Frames. This re-ordering is accomplished by using suitable write addressing for that framestore memory.

It is convenient to arrange for interleaving the soft decoding results from the first CCC decoding apparatus 27 and the second CCC decoding apparatus 28 in the following ways. Memory within the first CCC decoding apparatus 27 temporarily stores an M/H Group to be decoded, and the contents of that memory are updated as turbo decoding progresses. If turbo decoding by the first CCC decoding apparatus 27 concludes early, the turbo decoding results are retained in the memory therein. When the next M/H Group to be decoded is received, the memory within the first CCC decoding apparatus 27 is read to provide first input signal for the time-division multiplexer 29, such reading being done just before the next M/H Group to be decoded writes over the previously stored contents of that memory. The memory within the first CCC decoding apparatus 27 is preferably dual-ported random access memory (RAM) insofar as 3-bit symbols from 8-VSB signals are concerned. If so, writing and updating of the temporarily stored contents of that RAM is done via a random-access input port of the RAM, and reading from the RAM is done via a serial output port of the RAM. The memory within the first CCC decoding apparatus 27 further includes memory for extrinsic data, and the extrinsic data in that memory are bulk-erased just before the next M/H Group to be decoded is written to the dual-ported RAM.

Similarly, memory within the second CCC decoding apparatus 28 temporarily stores the M/H Group to be decoded, and the contents of that memory are updated as turbo decoding progresses. If turbo decoding by the second CCC decoding apparatus 28 concludes early, the turbo decoding results are retained in the memory therein. When the next M/H Group to be decoded is received, the memory within the second CCC decoding apparatus 28 is read to provide second input signal for the time-division multiplexer 29, such reading being done just before the next M/H Group to be decoded writes over the previously stored contents of that memory. The memory within the second CCC decoding apparatus 28 is preferably a dual-ported random access memory (RAM) insofar as 3-bit symbols from 8-VSB signals are concerned. If so, writing and updating of the temporarily stored contents of that RAM is done via a random-access input port of the RAM, and reading from the RAM is done via a serial output port of the RAM. The memory within the second CCC decoding apparatus 28 further includes memory for extrinsic data, and the extrinsic data in that memory are bulk-erased just before the next M/H Group to be decoded is written to the dual-ported RAM.

Figure 5:
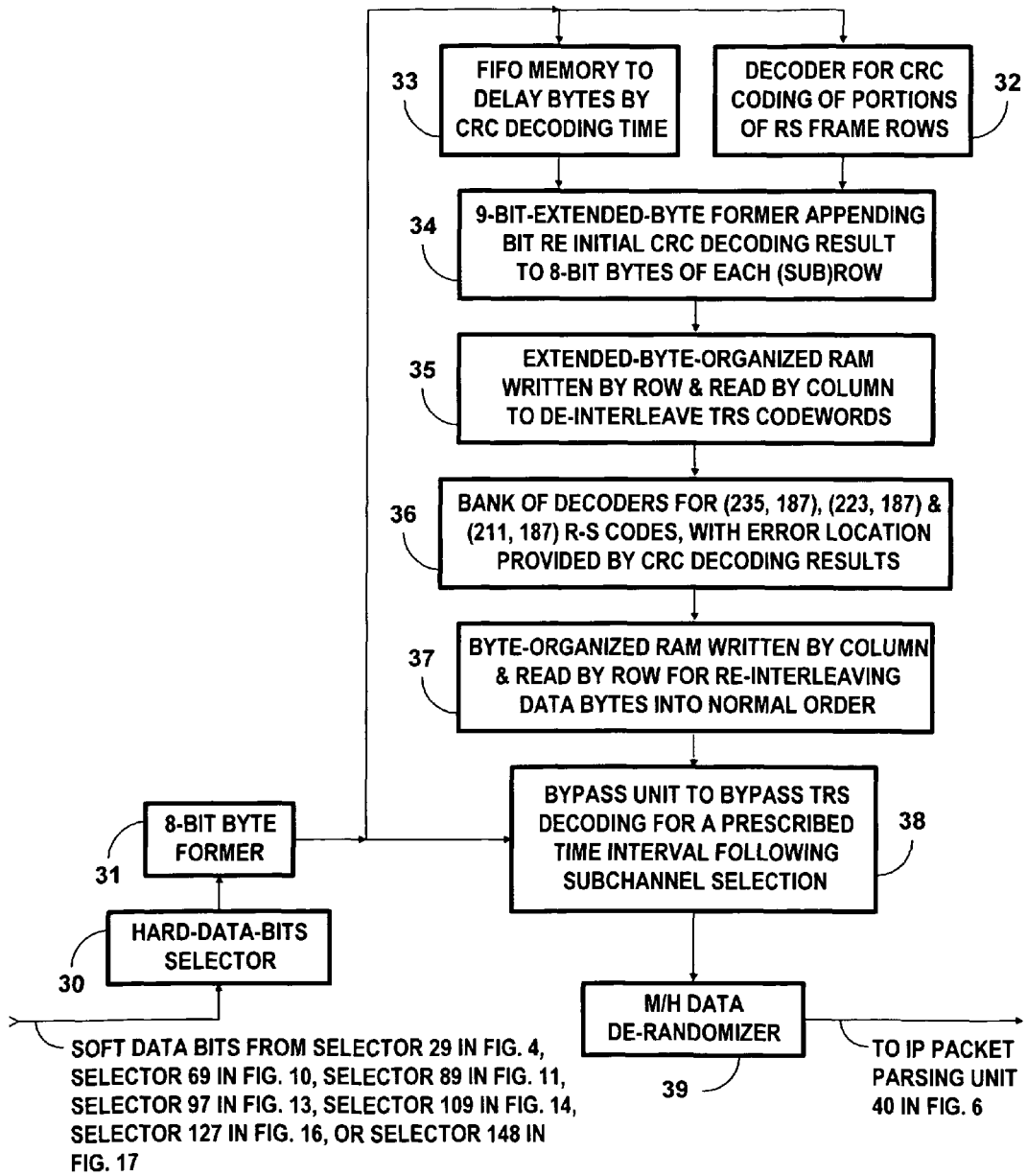
FIG. 5 is a block schematic diagram of the portion of the M/H receiver apparatus for decoding cyclic redundancy check (CRC) codes in the turbo decoding results, decoding TRS codewords using the results of CRC decoding to locate byte errors for TRS decoding, and de-randomizing the TRS decoding results to recover a transport stream of MPEG-2 data packets.
Figure 11:
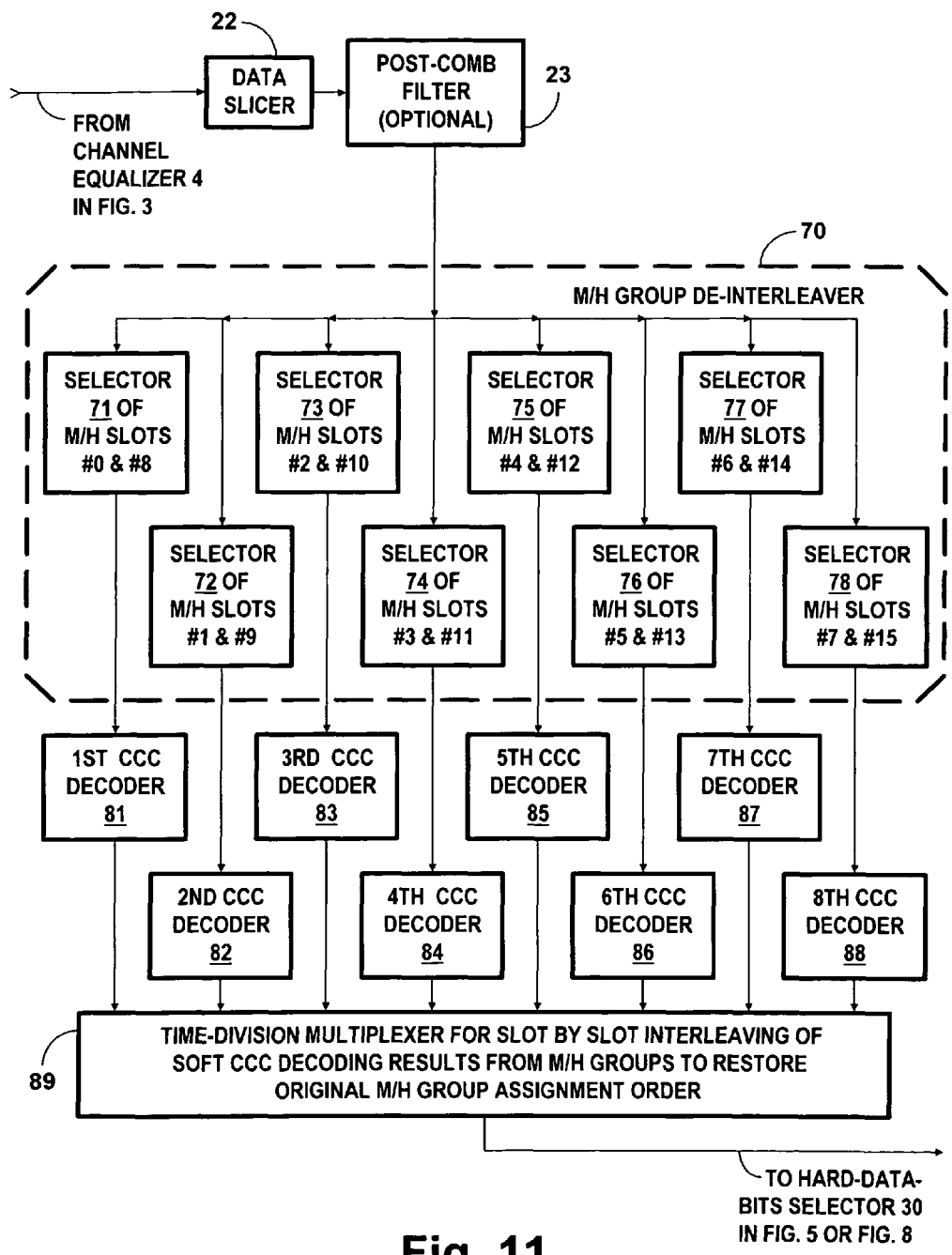
FIG. 11 is a block schematic drawing of the portion of an M/H receiver apparatus per FIG. 9 that employs eight CCC decoders for turbo decoding.
Figure 17:
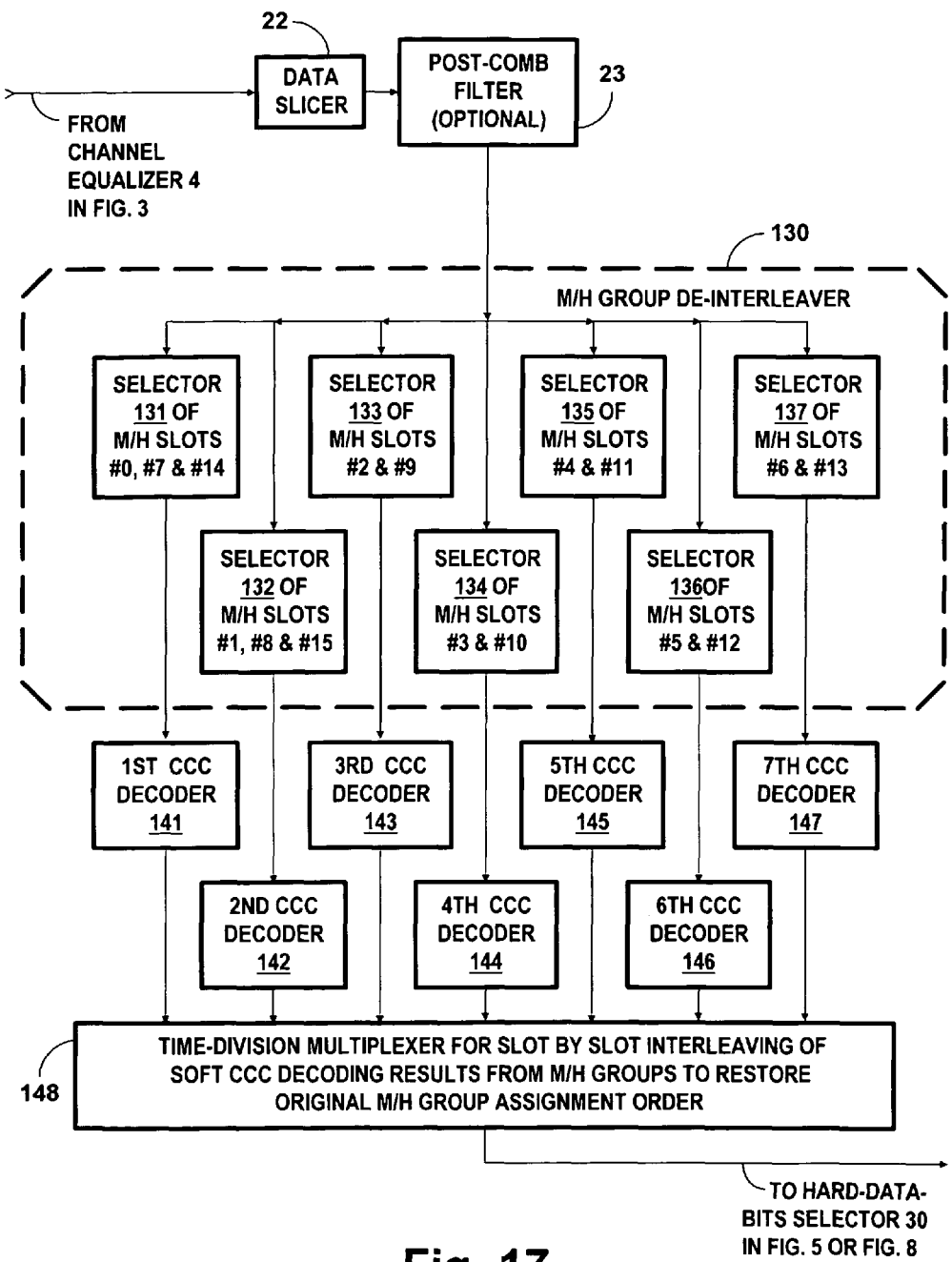
FIG. 17 is a block schematic drawing of the portion of an M/H receiver apparatus per FIG. 15 that employs seven CCC decoders for turbo decoding.

Referring to FIG. 5, a hard-data-bits selector 30 has an input port connected for receiving soft data bits from the output port of the time-division multiplexer 29 in FIG. 4, the time-division multiplexer 69 in FIG. 10, the time-division multiplexer 89 in FIG. 11, the time-division multiplexer 97 in FIG. 13, the time-division multiplexer 109 in FIG. 14, the time-division multiplexer 127 in FIG. 14 or the time-division multiplexer 148 in FIG. 17. The hard-data-bits selector 30 has an output port connected for supplying an 8-bit-byte former 31 with hard data bits selected from respective ones of the soft data bits. In its response the 8-bit-byte former 31 forms the hard data bits received from the hard-data-bits selector 30 into eight-bit bytes.

Successions of these 8-bit bytes that will be used for reproducing respective rows of bytes in RS Frames are supplied to a decoder 32 for cyclic-redundancy-check (CRC) coding and to a byte-organized first-in, first-out memory 33. Each row of bytes for an RS Frame has a 2-byte checksum appended to the conclusion thereof, thus to form a CRC codeword. After the decoder 32 has received each complete CRC codeword, the decoder 32 generates a bit indicating whether or not it found the row of bytes for an RS Frame contained within the CRC codeword to contain error. The FIFO memory 33 reproduces each successive row of bytes for an RS Frame it receives, as delayed for the duration of the CRC codeword containing that row of bytes, and supplies those delayed 8-bit bytes to a nine-bit-extended-byte former 34. The extended-byte former 34 appends to each of the 8-bit bytes the bit indicating whether or not the decoder 32 found the CRC codeword that it was contained in to contain error.

The resulting extended bytes are written row by row into respective rows of extended-byte storage locations in a random-access memory 35 operated to perform the matrix-type block de-interleaving procedure that is a first step of the TRS decoding routine. The RAM 35 is subsequently read one column of 9-bit extended bytes at a time to a selected one of a bank 36 of decoders for (235, 187), (223, 187) and (211, 187) Reed-Solomon codes, respectively. A/153 prescribes these (235, 187), (223, 187) and (211, 187) RS codes for TRS coding. The decoding control unit 7 selects the appropriate decoder in response to information extracted from the TPC. The extension bits accompanying the 8-bit bytes of the TRS coding are used to help locate byte errors for decoding the TRS coding, as is described in further detail in the published patent application US-2010-0293433-A1, with reference to FIG. 36 of its drawings. Such previous location of byte errors facilitates successful use of a Reed-Solomon algorithm capable of correcting more byte errors than an algorithm that must locate byte errors as well as correct them. The 8-bit data bytes that have been corrected insofar as possible by the selected one of the RS decoders in the bank 36 are written, column by column, into respective columns of byte-storage locations of a random-access memory 37. The RAM 37 is operated to perform the matrix-type block re-interleaving procedure for data bytes in further steps of the TRS decoding routine.

In a final step of the TRS decoding routine, the byte-storage locations in the RAM 37 are read from row-by-row for supplying reproduced randomized M/H data to a bypass unit 38. The bypass unit 38 usually relays this reproduced randomized M/H data to an M/H data de-randomizer 39. The bypass unit 38 is connected to bypass TRS decoding for a prescribed time interval following selection of a new sub-channel for reception, however, supplying the data de-randomizer 99 with bytes of randomized M/H data taken directly from the response of the byte former 31. A representative construction of the bypass unit 38 is shown in FIG. 19 of patent application US-2010-0100793-A1 of A. L. R. Limberg published 22 Apr. 2010 and titled "Digital television systems employing concatenated convolutional coded data". The M/H data de-randomizer 39 de-randomizes the bytes of that signal by converting them to serial-bit form and exclusive-ORing the bits with a pseudo-random bit sequence prescribed in A/53 and A/153. The M/H data de-randomizer 39 converts the de-randomized bits into bytes of M/H data and supplies those bytes to an IP-packet parsing unit 40 shown in FIG. 6.

Figure 6:
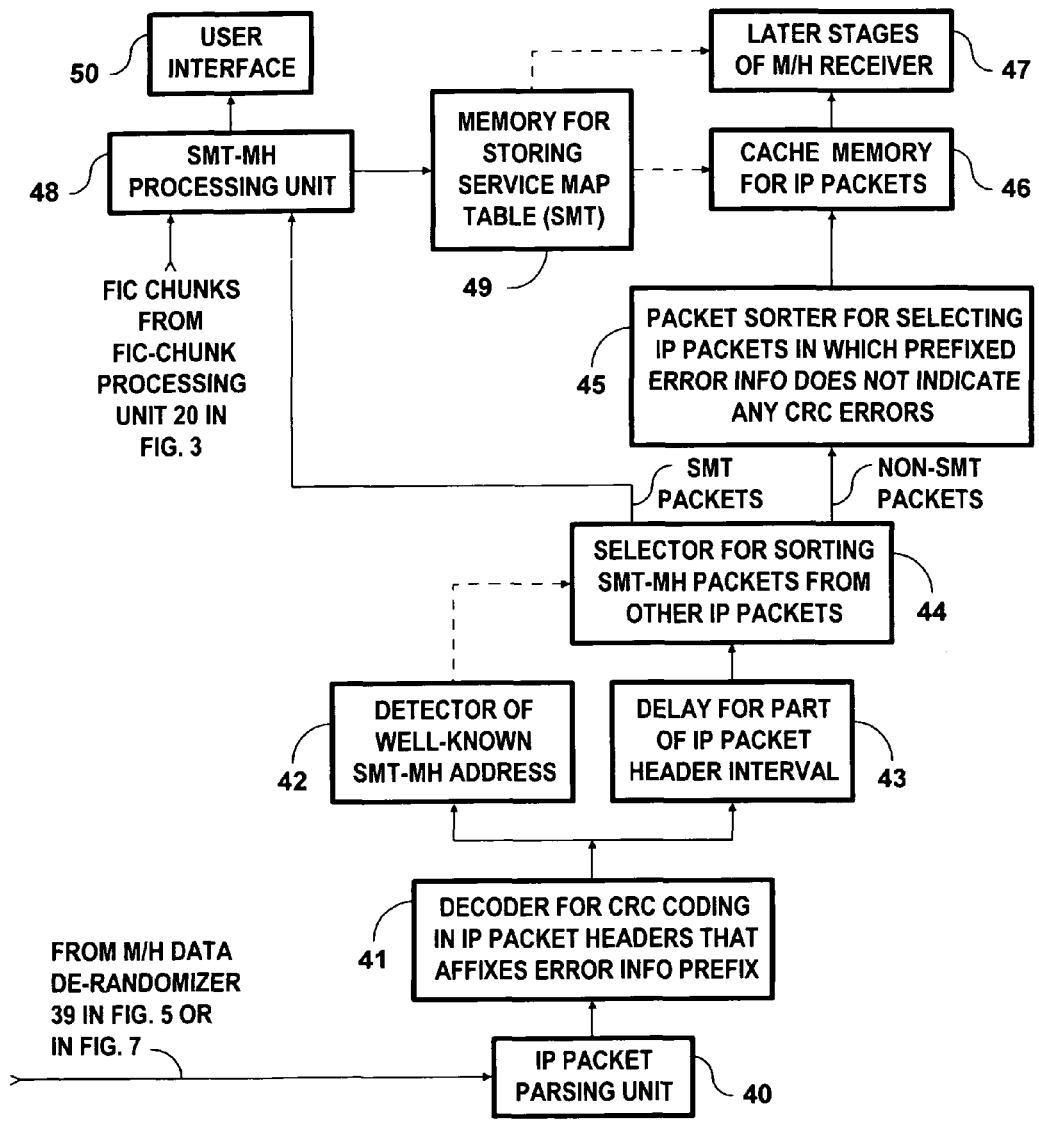
FIG. 6 is a block schematic diagram of the portion of the M/H receiver apparatus for parsing data from the transport stream of MPEG-2 data packets to recover a transport stream of internet-protocol (IP) data packets.

Referring now to FIG. 6, the IP-packet parsing unit 40 is connected for receiving as input signal thereto the bytes of de-randomized M/H data supplied from the M/H data de-randomizer 39. The parsing unit 40 is operable for parsing the data stream it receives into internet-protocol (IP) packets. The IP-packet parsing unit 40 performs this parsing responsive to two-byte row headers respectively transmitted at the beginning of each row of IP data in the RS Frame. This row header indicates where the earliest start of an IP packet occurs within the row of IP data bytes within the RS Frame. If a short IP packet is completely contained within a row of the RS Frame, the IP-packet parsing unit 40 calculates the start of a later IP packet, proceeding from the packet length information contained in the earlier IP packet within that same row of the RS Frame.

The IP-packet parsing unit 40 is connected for supplying IP packets to a decoder 41 for cyclic-redundancy-check coding within the IP packets. Each IP packet contains a two-byte, 16-bit checksum for CRC coding that IP packet. The decoder 41 is constructed to preface each IP packet that it reproduces with a prefix bit indicating whether or not error has been detected in that IP packet. The decoder 41 is connected to supply these IP packets as so prefaced to a detector 42 of a "well-known" SMT-MH address and to a delay unit 43. The delay unit 43 delays the IP packets supplied to a packet selector 44 for selecting SMT-MH packets from other IP packets. The delay unit 43 provides delay of a part of an IP packet header interval, which delay is long enough for the detector 42 to ascertain whether or not the "well-known" SMT-MH address is detected.

If the detector 42 does not detect the "well-known" SMT-MH address in the IP packet, the detector 42 output response conditions the packet selector 44 to reproduce the IP packet for application to a packet sorter 45 as input signal thereto.

The packet sorter 45 sorts out those IP packets in which the preface provides no indication of CRC coding error for writing to a cache memory 46 for IP packets. The prefatory prefix bit before each of the IP packets indicating whether there is CRC code error in its respective bytes is omitted when writing the cache memory 46. The cache memory 46 temporarily stores at least those IP packets not determined to contain CRC code error for possible future reading to the later stages 47 of the receiver. These later stages 47 of the receiver are sometimes referred to as the "upper layers" of the receiver.

If the detector 47 does detect the "well-known" SMT-MH address in the IP packet, establishing it as an SMT-MH packet, the detector 47 output response conditions the packet selector 49 to reproduce the SMT-MH packet for application to an SMT-MH processing unit 48, which includes circuitry for generating control signals for the later stages 47 of the M/H receiver. FIG. 6 shows the SMT-MH processing unit 48 connected for receiving FIC information from the FIC processing unit 20 in FIG. 3. The SMT-MH processing unit 48 integrates this FIC information with information from SMT-MH packets during the generation of Service Map Data. The Service Map Data generated by the SMT-MH processing unit 48 is written into memory 49 for temporary storage therewithin and subsequent application to the later stages 47 of the M/H receiver. The SMT-MH processing unit 48 relays those SMT-MH packets that have bit prefixes that do not indicate error in the packets to a user interface 50, which includes an Electronic Service Guide (ESG) and apparatus for selectively displaying the ESG on the viewing screen of the M/H receiver. Patent application US-2010-0061465-A1 of A. L. R. Limberg published 11 Mar. 2010 and titled "Sub-channel acquisition in a digital television receiver designed to receive Mobile/Handheld signals" provides more detailed descriptions of the operations of the portion of an M/H receiver shown in FIG. 6. The description with reference to the drawing FIGS. 12, 13 and 14 of that application describe operations relying on the SMT-MH tables available in A/153.

FIG. 7 is an assembly drawing that shows how FIGS. 3, 4, 8 and 6 combine to provide a schematic diagram of alternative receiver apparatus for receiving M/H transmissions sent over the air. The FIG. 7 M/H receiver apparatus is similar to the FIG. 2 M/H receiver apparatus except for the portion of the FIG. 2 M/H receiver apparatus shown in FIG. 5 being replaced by the portion of the FIG. 7 M/H receiver apparatus shown in FIG. 8. In the portion of the FIG. 7 M/H receiver apparatus for decoding TRS codewords that is shown in FIG. 8 the results of turbo decoding are used to locate byte errors for TRS decoding, rather than the results of decoding CRC codewords being used to locate byte errors.

Referring to FIG. 7, the hard-data-bits selector 30 has an input port connected for receiving soft data bits from the output port of the time-division multiplexer 29 in FIG. 4, the time-division multiplexer 69 in FIG. 10, the time-division multiplexer 89 in FIG. 11, the time-division multiplexer 97 in FIG. 13, the time-division multiplexer 109 in FIG. 14, the time-division multiplexer 127 in FIG. 14 or the time-division multiplexer 148 in FIG. 17. The hard-data-bits selector 30 is connected for supplying the 8-bit-byte former 31 with hard data bits selected from the bits of the soft X-sub-2 bits. The 8-bit-byte former 31 is operable to form eight-bit bytes responsive to successive hard data bits received from the hard-data-bits selector 30. The output port of the 8-bit-byte former 31 is connected for supplying these 8-bit bytes to a first input port of an extended-byte former 51. The extended-byte former 51 is operable to append to each 8-bit byte a bit or bits supplied to a second input port thereof, which bit or bits regard a respective lack-of-confidence level for that particular 8-bit byte. An output port of the extended-byte former 51 is connected to supply extended bytes, 8-bit portions of which describe bytes of TRS coding, for being written in rows of bytes within RS Frames temporarily stored in the RAM 35.

After the writing of each RS Frame concludes, columns of bytes in that RS Frame that is temporarily stored in the RAM 35 define respective TRS codewords. The RAM 35 is operable for successively reading these columns of bytes to a selected one of the bank 36 of decoders for TRS codewords, which selected decoder is selectively connected for supplying its decoding results to be written into the byte-organized RAM 37. The RAM 37 is operable for re-interleaving data bytes into normal order for application to a first input port of the bypass unit 38, the second input port of which is connected for receiving 8-bit data bytes directly from the output port of the 8-bit-byte former 31. The output port of the bypass unit 38 is connected for supplying the 8-bit data bytes reproduced therefrom to the input port of the M/H data de-randomizer 39. The output port of the M/H data de-randomizer 39 connects to the input port of the IP-packet parsing unit 40 shown in FIG. 6. The connections and operation of the elements 35 through 39 in the portion of M/H receiver apparatus shown in FIG. 8 are essentially the same as in the portion of M/H receiver apparatus shown in FIG. 5.

FIG. 8 shows a battery 52 of exclusive-OR gates connected to receive soft data bits supplied from the output port of the time-division multiplexer 29 in FIG. 4, the time-division multiplexer 69 in FIG. 10, the time-division multiplexer 89 in FIG. 11, the time-division multiplexer 97 in FIG. 13, the time-division multiplexer 109 in FIG. 14, the time-division multiplexer 127 in FIG. 14 or the time-division multiplexer 148 in FIG. 17. These XOR gates exclusive-OR the bits of each soft data bit supplied from one of the time-division multiplexers 29, 69, 89, 97, 100, 127 or 148 with a corresponding hard data bit supplied from the hard-data-bits selector 30. The response from the battery 52 of XOR gates provides successive plural-bit indications, each defining a normalized lack-of-confidence level regarding a respective soft data bit. A selector 53 is operable to reproduce at an output port thereof the largest of the normalized lack-of-confidence levels for each consecutive non-overlapping set of eight soft data bits, which lack-of-confidence level is to be ascribed to a corresponding 8-bit byte supplied by the 8-bit-byte former 31. The output port of the selector 53 is connected to supply the successive plural-bit lack-of-confidence levels reproduced thereat to the second input port of the extended-byte former 51 to be appended to the corresponding 8-bit byte supplied by the 8-bit-byte former 31.

FIG. 9 is an assembly drawing that shows how FIG. 3, FIG. 10 or 11, FIG. 5 or 8, and FIG. 6 combine to provide schematic diagrams of various receiver apparatuses for receiving M/H transmissions sent over the air. Each of these receiver apparatuses employs more than two CCC decoders for turbo decoding.

FIG. 10 shows a portion of an M/H receiver apparatus per FIG. 9 that includes an M/H Group de-interleaver 60 composed of four selectors 61, 62, 63 and 64 selecting M/H Groups supplied as input signals to four CCC decoding apparatuses 65, 66, 67 and 68 for turbo decoding. If the M/H transmissions are SCCC transmissions as prescribed by A/153, each of the CCC decoding apparatuses 65, 66, 67 and 68 is of a type for decoding SCCC at one-half or one-quarter the code rate of 8-VSB. The adaptive channel-equalizer 4 in FIG. 3 is connected to supply its response at Nyquist rate to the input port of the data slicer 22 in FIG. 10. The data slicer 22 is operable to supply soft data bits responsive to the channel-equalizer 4 response that the data slicer 22 receives as input signal thereto. The data slicer 22 is connected to supply these soft data bits to the post-comb filter 23 that is used when receiving 8-VSB DTV signals as prescribed by A/153. The output port of the post-comb filter 23 is connected for supplying its response to the input port of the M/H Group de-interleaver 60. However, if the CCC used for M/H-service transmissions does not employ interference-filter pre-coding of the most significant bits of the 3-bit sequences used to define 8-VSB symbols, the post-comb filter 23 is not used. Instead, there is a direct connection from the output port of the data slicer 22 to the input port of the M/H Group de-interleaver 60.

FIG. 10 shows the M/H Group de-interleaver 60 to be composed of a first selector 61, a second selector 62, a third selector 63 and a fourth selector 64 having respective input ports connected from the input port of the de-interleaver 60. The first selector 61 is operable for selecting M/H Groups in M/H Slots #0, #4, #8 and #12 to be supplied from a first output port of the M/H Group de-interleaver 60 to the input port of first CCC decoding apparatus 65. The second selector 62 is operable for selecting M/H Groups in M/H Slots #1, #5, #9 and #13 to be supplied from a second output port of the M/H Group de-interleaver 60 to the input port of second CCC decoding apparatus 66. The third selector 63 is operable for selecting M/H Groups in M/H Slots #2, #6, #10 and #14 to be supplied from a third output port of the M/H Group de-interleaver 60 to the input port of third CCC decoding apparatus 67. The fourth selector 64 is operable for selecting M/H Groups in M/H Slots #3, #7, #11 and #15 to be supplied from a fourth output port of the M/H Group de-interleaver 60 to the input port of fourth CCC decoding apparatus 68.

FIG. 10 shows a time-division multiplexer 69 having first, second, third and fourth input ports to which the output ports of the CCC decoding apparatuses 65, 66, 67 and 68 respectively connect. The time-division multiplexer 69 is operable for interleaving the soft decoding results from the CCC decoding apparatuses 65, 66, 67 and 68, M/H Group by M/H Group. The interleaving is done so as to restore the combined soft decoding results to the original Slot order in which the M/H Groups were received. That is, the order of the soft decoding results from M/H Groups that the time-division multiplexer 69 is operable to supply from its output port conforms to the M/H Group Assignment Order in M/H sub-Frames shown in FIG. 1.

If the CCC decoding apparatuses 61, 62, 63 and 64 do not commence decoding each M/H Group until it has been fully received, each of them will have nearly three M/H Slot intervals in which to perform turbo decoding procedures on each M/H Group. Each of the CCC decoding apparatuses 61, 62, 63 and 64 may be constructed from a number of component CCC decoders that further de-interleave each M/H Group for substantially parallel CCC decoding procedures. Each of such component CCC decoders will then have nearly four full M/H Slot intervals in which to perform turbo decoding procedures on each M/H Group. Each of the CCC decoding apparatuses 61, 62, 63 and 64 includes respective memory. The writing to that respective memory and the reading from that respective memory are preferably done similarly to the preferable ways for writing to and reading from the memory within the CCC decoding apparatus 27 described supra.

FIG. 11 shows a portion of an M/H receiver apparatus per FIG. 9 that includes an M/H Group de-interleaver 70 composed of eight selectors 71, 72, 73, 74, 75, 76, 77 and 78 for selecting M/H Groups supplied as input signals to eight CCC decoders 81, 82, 83, 84, 85, 86, 87 and 88 for turbo decoding. If the M/H transmissions are SCCC transmissions as prescribed by A/153, each of the CCC decoders 81, 82, 83, 84,

85, 86, 87 and 88 is of a type for decoding SCCC at one-half or one-quarter the code rate of 8-VSB. The adaptive channel-equalizer 4 in FIG. 3 is connected to supply its response at Nyquist rate to the input port of the data slicer 22 in FIG. 11. The data slicer 22 is operable to supply soft data bits responsive to the channel-equalizer 4 response that the data slicer 22 receives as input signal thereto. The data slicer 22 is connected to supply these soft data bits to the post-comb filter 23 that is used when receiving 8-VSB DTV signals as prescribed by A/153. The output port of the post-comb filter 23 is connected for supplying its response to the input port of the M/H Group de-interleaver 70. However, if the CCC used for M/H-service transmissions does not employ interference-filter pre-coding of the most significant bits of the 3-bit sequences used to define 8-VSB symbols, the post-comb filter 23 is not used. Instead, there is a direct connection from the output port of the data slicer 22 to the input port of the M/H Group de-interleaver 70.

FIG. 11 shows the respective input ports of the eight selectors 71, 72, 73, 74, 75, 76, 77 and 78 connected from the input port of the de-interleaver 70. The first selector 71 is operable for selecting M/H Groups in M/H Slots #0 and #8 to be supplied from a first output port of the M/H Group de-interleaver 70 to the input port of the first CCC decoder 81. The second selector 72 is operable for selecting M/H Groups in M/H Slots #1 and #9 to be supplied from a second output port of the M/H Group de-interleaver 70 to the input port of the second CCC decoder 82. The third selector 73 is operable for selecting M/H Groups in M/H Slots #2 and #10 to be supplied from a third output port of the M/H Group de-interleaver 70 to the input port of the third CCC decoder 83. The fourth selector 74 is operable for selecting M/H Groups in M/H Slots #3 and #11 to be supplied from a fourth output port of the M/H Group de-interleaver 70 to the input port of fourth CCC decoder 84. The fifth selector 75 is operable for selecting M/H Groups in M/H Slots #4 and #12 to be supplied from a fifth output port of the M/H Group de-interleaver 70 to the input port of the fifth CCC decoder 85. The sixth selector 76 is operable for selecting M/H Groups in M/H Slots #5 and #13 to be supplied from a sixth output port of the M/H Group de-interleaver 70 to the input port of the sixth CCC decoder 86. The seventh selector 77 is operable for selecting M/H Groups in M/H Slots #6 and #14 to be supplied from a seventh output port of the M/H Group de-interleaver 70 to the input port of the seventh CCC decoder 87. The eighth selector 78 is operable for selecting M/H Groups in M/H Slots #7 and #15 to be supplied from an eighth output port of the M/H Group de-interleaver 70 to the input port of the eighth CCC decoder 88.

FIG. 11 shows a time-division multiplexer 89 having first, second, third, fourth, fifth, sixth, seventh and eighth input ports to which the output ports of the CCC decoders 81, 82, 83, 84, 85, 86, 87 and 88 respectively connect. The time-division multiplexer 89 is operable for interleaving the soft decoding results from the CCC decoders 81, 82, 83, 84, 85, 86, 87 and 88, M/H Group by M/H Group. The interleaving is done so to restore the combined soft decoding results to the original Slot order in which the M/H Groups were received. That is, the order of the soft decoding results from M/H Groups that the time-division multiplexer 89 is operable to supply from its output port conforms to the M/H Group Assignment Order in M/H sub-Frames shown in FIG. 1. If the CCC decoders 81, 82, 83, 84, 85, 86, 87 and 88 do not commence decoding each M/H Group until it has been fully received, each of them will have fifteen M/H Slot intervals in which to perform turbo decoding procedures on each M/H Group. This is because A/153 limits the M/H Parades to containing no more than eight M/H Groups. Each of the CCC decoders 81, 82, 83, 84, 85, 86, 87 and 88 includes respective memory. The writing to that respective memory and the reading from that respective memory are preferably done similarly to the preferable ways for writing to and reading from the memory within the CCC decoding apparatus 27 described supra.

FIG. 12 is an assembly drawing that shows how FIG. 3, FIG. 13 or 14, FIG. 5 or 8, and FIG. 6 combine to provide schematic diagrams of various receiver apparatuses for receiving M/H transmissions sent over the air. The FIG. 13 receiver apparatus employs three CCC decoding apparatuses for turbo decoding. The FIG. 14 receiver apparatus employs five CCC decoders for turbo decoding.

FIG. 13 shows a portion of an M/H receiver apparatus per FIG. 12 that includes an M/H Group de-interleaver 90 composed of three selectors 91, 92 and 93 selecting M/H Groups supplied as input signals to three CCC decoding apparatuses 94, 95 and 96 for turbo decoding. If the M/H transmissions are SCCC transmissions as prescribed by A/153, each of the CCC decoding apparatuses 94, 95 and 96 is of a type for decoding SCCC at one-half or one-quarter the code rate of 8-VSB. The adaptive channel-equalizer 4 in FIG. 3 is connected to supply its response at Nyquist rate to the input port of the data slicer 22 in FIG. 13. The data slicer 22 is operable to supply soft data bits responsive to the channel-equalizer 4 response that the data slicer 22 receives as input signal thereto. The data slicer 22 is connected to supply these soft data bits to the post-comb filter 23 that is used when receiving 8-VSB DTV signals as prescribed by A/153. The output port of the post-comb filter 23 is connected for supplying its response to the input port of the M/H Group de-interleaver 90. However, if the CCC used for M/H-service transmissions does not employ interference-filter pre-coding of the most significant bits of the 3-bit sequences used to define 8-VSB symbols, the post-comb filter 23 is not used. Instead, there is a direct connection from the output port of the data slicer 22 to the input port of the M/H Group de-interleaver 90.

FIG. 13 shows the M/H Group de-interleaver 90 to be composed of a first selector 91, a second selector 92 and a third selector 93 having respective input ports connected from the input port of the de-interleaver 90. The first selector 91 is operable for selecting M/H Groups in M/H Slots #0, #3, #6, #9, #12 and #15 to be supplied from a first output port of the M/H Group de-interleaver 90 to the input port of first CCC decoding apparatus 94. The second selector 92 is operable for selecting M/H Groups in M/H Slots #1, #4, #7, #10 and #13 to be supplied from a second output port of the M/H Group de-interleaver 90 to the input port of second CCC decoding apparatus 95. The third selector 93 is operable for selecting M/H Groups in M/H Slots #2, #5, #8, #11 and #14 to be supplied from a third output port of the M/H Group de-interleaver 90 to the input port of third CCC decoding apparatus 96.

FIG. 13 shows a time-division multiplexer 97 having first, second and third input ports to which the output ports of the CCC decoding apparatuses 94, 95 and 96 respectively connect. The time-division multiplexer 97 is operable for interleaving the soft decoding results from the CCC decoding apparatuses 94, 95 and 96, M/H Group by M/H Group. The interleaving is done so to restore the combined soft decoding results to the original Slot order in which the M/H Groups were received. That is, the order of the soft decoding results from M/H Groups that the time-division multiplexer 97 is operable to supply from its output port conforms to the M/H Group Assignment Order in M/H sub-Frames shown in FIG. 1.

If the CCC decoding apparatuses 91, 92 and 93 do not commence decoding each M/H Group until it has been fully received, each of them will have two M/H Slot intervals in which to perform turbo decoding procedures on each M/H Group. Each of the CCC decoding apparatuses 61, 62, 63 and 64 may be constructed from a number of component CCC decoders that further de-interleave each M/H Group for substantially parallel CCC decoding procedures. Each of such component CCC decoders will then have nearly three full M/H Slot intervals in which to perform turbo decoding procedures on each M/H Group. Each of the CCC decoding apparatuses 91, 92 and 93 includes respective memory. The writing to that respective memory and the reading from that respective memory are preferably done similarly to the preferable ways for writing to and reading from the memory within the CCC decoding apparatus 27 described supra.

FIG. 14 shows a portion of an M/H receiver apparatus per FIG. 9 that includes an M/H Group de-interleaver 98 composed of five selectors 99, 100, 101, 102 and 103 for selecting M/H Groups supplied as input signals to five CCC decoders 104, 105, 106, 107 and 108 for turbo decoding. If the M/H transmissions are SCCC transmissions as prescribed by A/153, each of the CCC decoders 104, 105, 106, 107 and 108 is of a type for decoding SCCC at one-half or one-quarter the code rate of 8-VSB. The adaptive channel-equalizer 4 in FIG. 3 is connected to supply its response at Nyquist rate to the input port of the data slicer 22 in FIG. 14. The data slicer 22 is operable to supply soft data bits responsive to the channel-equalizer 4 response that the data slicer 22 receives as input signal thereto. The data slicer 22 is connected to supply these soft data bits to the post-comb filter 23 that is used when receiving 8-VSB DTV signals as prescribed by A/153. The output port of the post-comb filter 23 is connected for supplying its response to the input port of the M/H Group de-interleaver 98. However, if the CCC used for M/H-service transmissions does not employ interference-filter pre-coding of the most significant bits of the 3-bit sequences used to define 8-VSB symbols, the post-comb filter 23 is not used. Instead, there is a direct connection from the output port of the data slicer 22 to the input port of the M/H Group de-interleaver 98.

FIG. 14 shows the respective input ports of the five selectors 99, 100, 101, 102 and 103 connected from the input port of the de-interleaver 98. The first selector 99 is operable for selecting M/H Groups in M/H Slots #0, #5, #10 and #15 to be supplied from a first output port of the M/H Group de-interleaver 98 to the input port of the first CCC decoder 104. The second selector 100 is operable for selecting M/H Groups in M/H Slots #1, #6 and #11 to be supplied from a second output port of the M/H Group de-interleaver 98 to the input port of the second CCC decoder 105. The third selector 101 is operable for selecting M/H Groups in M/H Slots #2, #7 and #12 to be supplied from a third output port of the M/H Group de-interleaver 98 to the input port of the third CCC decoder 106. The fourth selector 102 is operable for selecting M/H Groups in M/H Slots #3, #8 and #13 to be supplied from a fourth output port of the M/H Group de-interleaver 98 to the input port of fourth CCC decoder 107. The fifth selector 103 is operable for selecting M/H Groups in M/H Slots #4, #9 and #14 to be supplied from a fifth output port of the M/H Group de-interleaver 98 to the input port of the fifth CCC decoder 108.

FIG. 14 shows a time-division multiplexer 109 having first, second, third, fourth and fifth input ports to which the output ports of the CCC decoders 104, 105, 106, 107 and 108 respectively connect. The time-division multiplexer 109 is operable for interleaving the soft decoding results from the CCC decoders 104, 105, 106, 107 and 108, M/H Group by M/H Group. The interleaving is done so to restore the combined soft decoding results to the original Slot order in which the M/H Groups were received. That is, the order of the soft decoding results from M/H Groups that the time-division multiplexer 109 is operable to supply from its output port conforms to the M/H Group Assignment Order in M/H sub-Frames shown in FIG. 1. If the CCC decoders 104, 105, 106, 107 and 108 do not commence decoding each M/H Group until it has been fully received, each of them will have four M/H Slot intervals in which to perform turbo decoding procedures on each M/H Group. Each of the CCC decoders 104, 105, 106, 107 and 108 includes respective memory. The writing to that respective memory and the reading from that respective memory are preferably done similarly to the preferable ways for writing to and reading from the memory within the CCC decoding apparatus 27 described supra.

FIG. 15 is an assembly drawing that shows how FIG. 3, FIG. 16 or 17, FIG. 5 or 8, and FIG. 6 combine to provide schematic diagrams of various receiver apparatuses for receiving M/H transmissions sent over the air. The FIG. 16 receiver apparatus employs six CCC decoders for turbo decoding. The FIG. 17 receiver apparatus employs seven CCC decoders for turbo decoding.

Figure 16:
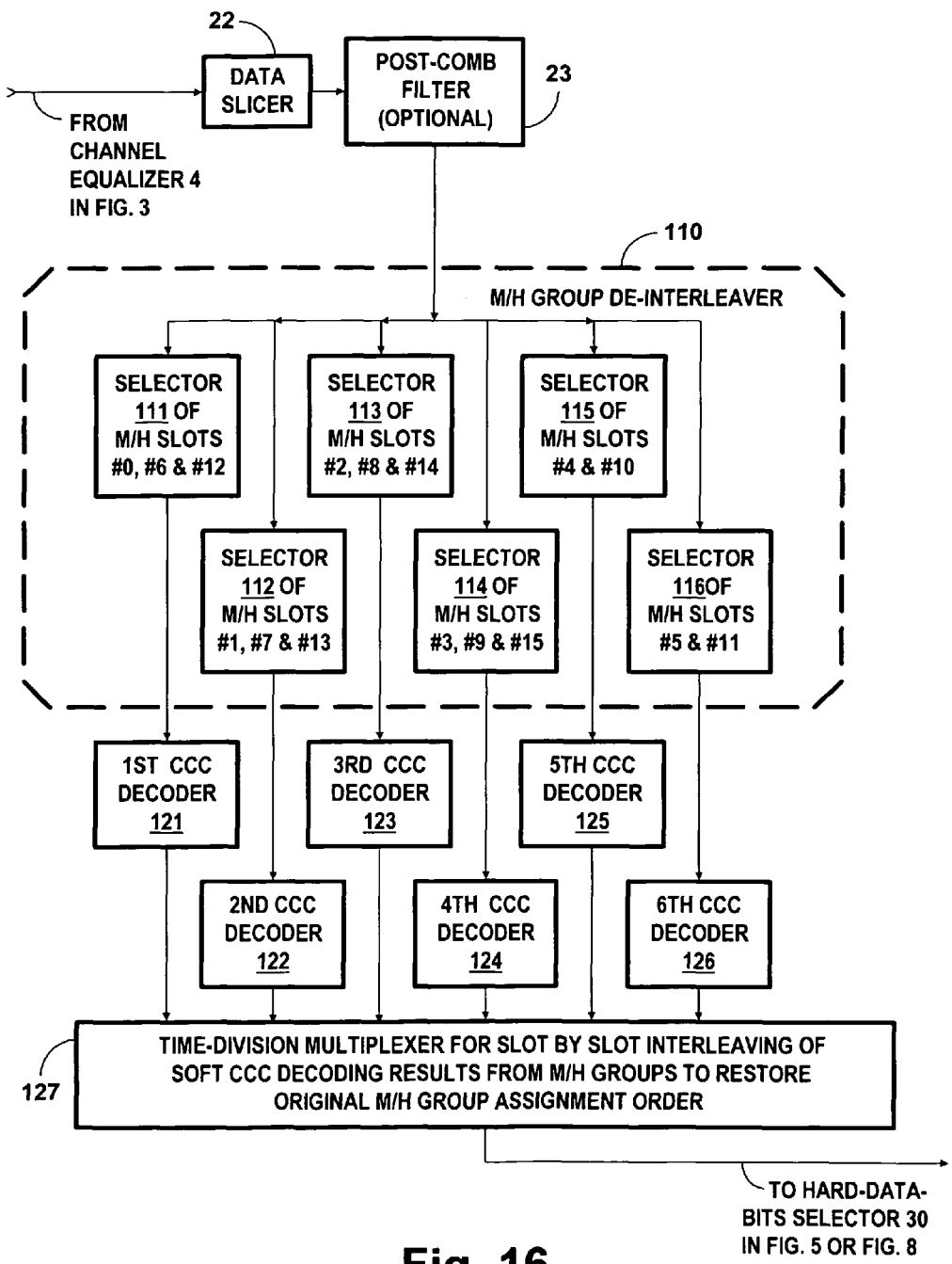
FIG. 16 is a block schematic drawing of the portion of an M/H receiver apparatus per FIG. 15 that employs six CCC decoders for turbo decoding.

FIG. 16 shows a portion of an M/H receiver apparatus per FIG. 15 that includes an M/H Group de-interleaver 110 composed of six selectors 111, 112, 113, 114, 115 and 116 for selecting M/H Groups supplied as input signals to six CCC decoders 121, 122, 123, 124, 125 and 126 for turbo decoding. If the M/H transmissions are SCCC transmissions as prescribed by A/153, each of the CCC decoders 121, 122, 123, 124, 125 and 126 is of a type for decoding SCCC at one-half or one-quarter the code rate of 8-VSB. The adaptive channel-equalizer 4 in FIG. 3 is connected to supply its response at Nyquist rate to the input port of the data slicer 22 in FIG. 16. The data slicer 22 is operable to supply soft data bits responsive to the channel-equalizer 4 response that the data slicer 22 receives as input signal thereto. The data slicer 22 is connected to supply these soft data bits to the post-comb filter 23 that is used when receiving 8-VSB DTV signals as prescribed by A/153. The output port of the post-comb filter 23 is connected for supplying its response to the input port of the M/H Group de-interleaver 110. However, if the CCC used for M/H-service transmissions does not employ interference-filter pre-coding of the most significant bits of the 3-bit sequences used to define 8-VSB symbols, the post-comb filter 23 is not used. Instead, there is a direct connection from the output port of the data slicer 22 to the input port of the M/H Group de-interleaver 110.

FIG. 16 shows the respective input ports of the six selectors 111, 112, 113, 114, 115 and 116 connected from the input port of the M/H Group de-interleaver 110. The first selector 111 is operable for selecting M/H Groups in M/H Slots #0, #6 and #12 to be supplied from a first output port of the M/H Group de-interleaver 110 to the input port of the first CCC decoder 121. The second selector 112 is operable for selecting M/H Groups in M/H Slots #1, #7 and #13 to be supplied from a second output port of the M/H Group de-interleaver 110 to the input port of the second CCC decoder 122. The third selector 113 is operable for selecting M/H Groups in M/H Slots #2, #8 and #14 to be supplied from a third output port of the M/H Group de-interleaver 110 to the input port of the third CCC decoder 123. The fourth selector 114 is operable for selecting M/H Groups in M/H Slots #3, #9 and #15 to be supplied from a fourth output port of the M/H Group de-interleaver 110 to the input port of fourth CCC decoder 124. The fifth selector 115 is operable for selecting M/H Groups in M/H Slots #4 and

10 to be supplied from a fifth output port of the M/H Group de-interleaver 110 to the input port of the fifth CCC decoder 125. The sixth selector 116 is operable for selecting M/H Groups in M/H Slots #5 and #11 to be supplied from a sixth output port of the M/H Group de-interleaver 110 to the input port of the sixth CCC decoder 126.

FIG. 16 shows a time-division multiplexer 127 having first, second, third, fourth, fifth and sixth input ports to which the output ports of the CCC decoders 121, 122, 123, 124, 125 and 126 respectively connect. The time-division multiplexer 127 is operable for interleaving the soft decoding results from the CCC decoders 121, 122, 123, 124, 125 and 126, M/H Group by M/H Group. The interleaving is done so to restore the combined soft decoding results to the original Slot order in which the M/H Groups were received. That is, the order of the soft decoding results from M/H Groups that the time-division multiplexer 127 is operable to supply from its output port conforms to the M/H Group Assignment Order in M/H sub-Frames shown in FIG. 1. If the CCC decoders 121, 122, 123, 124, 125 and 126 do not commence decoding each M/H Group until it has been fully received, each of them will have five M/H Slot intervals in which to perform turbo decoding procedures on each M/H Group. Each of the CCC decoders 121, 122, 123, 124, 125 and 126 includes respective memory. The writing to that respective memory and the reading from that respective memory are preferably done similarly to the preferable ways for writing to and reading from the memory within the CCC decoding apparatus 27 described supra.

FIG. 17 shows a portion of an M/H receiver apparatus per FIG. 15 that includes an M/H Group de-interleaver 130 composed of seven selectors 131, 132, 133, 134, 135, 136 and 137 for selecting M/H Groups supplied as input signals to seven CCC decoders 141, 142, 143, 144, 145, 146 and 147 for turbo decoding. If the M/H transmissions are SCCC transmissions as prescribed by A/153, each of the CCC decoders 141, 142, 143, 144, 145, 146 and 147 is of a type for decoding SCCC at one-half or one-quarter the code rate of 8-VSB. The adaptive channel-equalizer 4 in FIG. 3 is connected to supply its response at Nyquist rate to the input port of the data slicer 22 in FIG. 17. The data slicer 22 is operable to supply soft data bits responsive to the channel-equalizer 4 response that the data slicer 22 receives as input signal thereto. The data slicer 22 is connected to supply these soft data bits to the post-comb filter 23 that is used when receiving 8-VSB DTV signals as prescribed by A/153. The output port of the post-comb filter 23 is connected for supplying its response to the input port of the M/H Group de-interleaver 130. However, if the CCC used for M/H-service transmissions does not employ interference-filter pre-coding of the most significant bits of the 3-bit sequences used to define 8-VSB symbols, the post-comb filter 23 is not used. Instead, there is a direct connection from the output port of the data slicer 22 to the input port of the M/H Group de-interleaver 130.

FIG. 17 shows the respective input ports of the seven selectors 131, 132, 133, 134, 135, 136 and 137 connected from the input port of the M/H Group de-interleaver 130. The first selector 131 is operable for selecting M/H Groups in M/H Slots #0, #7 and #14 to be supplied from a first output port of the M/H Group de-interleaver 130 to the input port of the first CCC decoder 141. The second selector 132 is operable for selecting M/H Groups in M/H Slots #1, #8 and #15 to be supplied from a second output port of the M/H Group de-interleaver 130 to the input port of the second CCC decoder 142. The third selector 133 is operable for selecting M/H Groups in M/H Slots #2 and #9 to be supplied from a third output port of the M/H Group de-interleaver 130 to the input port of the third CCC decoder 143. The fourth selector 134 is operable for selecting M/H Groups in M/H Slots #3 and #10 to be supplied from a fourth output port of the M/H Group de-interleaver 130 to the input port of fourth CCC decoder 144. The fifth selector 135 is operable for selecting M/H Groups in M/H Slots #4 and #11 to be supplied from a fifth output port of the M/H Group de-interleaver 130 to the input port of the fifth CCC decoder 145. The sixth selector 136 is operable for selecting M/H Groups in M/H Slots #5 and #12 to be supplied from a sixth output port of the M/H Group de-interleaver 130 to the input port of the sixth CCC decoder 146. The seventh selector 137 is operable for selecting M/H Groups in M/H Slots #6 and #13 to be supplied from a seventh output port of the M/H Group de-interleaver 130 to the input port of the seventh CCC decoder 147.

FIG. 17 shows a time-division multiplexer 148 having first, second, third, fourth, fifth, sixth and seventh input ports to which the output ports of the CCC decoders 141, 142, 143, 144, 145, 146 and 147 respectively connect. The time-division multiplexer 148 is operable for interleaving the soft decoding results from the CCC decoders 141, 142, 143, 144, 145, 146 and 147, M/H Group by M/H Group. The interleaving is done so to restore the combined soft decoding results to the original Slot order in which the M/H Groups were received. That is, the order of the soft decoding results from M/H Groups that the time-division multiplexer 148 is operable to supply from its output port conforms to the M/H Group Assignment Order in M/H sub-Frames shown in FIG. 1. If the CCC decoders 141, 142, 143, 144, 145, 146 and 147 do not commence decoding each M/H Group until it has been fully received, each of them will have six M/H Slot intervals in which to perform turbo decoding procedures on each M/H Group. Each of the CCC decoders 141, 142, 143, 144, 145, 146 and 147 includes respective memory. The writing to that respective memory and the reading from that respective memory are preferably done similarly to the preferable ways for writing to and reading from the memory within the CCC decoding apparatus 27 described supra.

FIGS. 4, 10, 11, 13, 14, 16 and 17 show the time-division multiplexing of soft data bits from a plurality of CCC decoding apparatuses or CCC decoders. Such time-division multiplexing accommodates the confidence levels of the soft data bits being used for locating byte errors per FIG. 8 in preferred embodiments of the invention. If byte errors are located using the CRC coding of rows of bytes in RS Frames or portions of such rows, the plurality of CCC decoding apparatuses or CCC decoders need not supply soft data bits for the time-division multiplexing of respective decoding results. Instead, the plurality of CCC decoding apparatuses or CCC decoders can supply just hard data bits for the time-division multiplexing of respective decoding results.

Using only two CCC decoding apparatuses as depicted in FIG. 4, rather than more as depicted in FIGS. 10, 11, 13, 14, 16 and 17, for supplying respective CCC decoding results for subsequent decoding of TRS codewords in each of successive RS Frames appreciably reduces the memory requirements in an M/H receiver. The two CCC decoding apparatuses can have alternative use implementing other procedures than those described supra. These other procedures may involve change from receiving transmissions via one RF channel to receiving transmissions via another RF channel, for example. Other examples of alternative use of the two CCC decoding apparatuses concern iterative-diversity reception and frequency-diversity reception.

The U.S. patent application for A. L. R. Limberg titled "Digital television systems employing concatenated convolutional coded data" published 22 Apr. 2010 as US-2010-0100793-A1 describes M/H receivers each employing two CCC decoding apparatuses. The operations of the two CCC decoding apparatuses are not staggered in time, however. Rather, the two CCC decoding apparatuses are operated in parallel for decoding earlier and later transmissions of the same M/H data, respectively, in a system for iterative-diversity broadcasting of M/H data. There can be delays as long as several M/H Frames, plus or minus an M/H Slot interval, between the earlier and later transmissions of the same M/H data. One of these earlier and later M/H transmissions is confined to even-numbered M/H Slots, and the other of these earlier and later M/H transmissions is confined to odd-numbered M/H Slots. The parallel operation of the two CCC decoding apparatuses facilitates the exchange of decoding information between the two CCC decoding apparatuses to improve decoding in each of them. The final results of decoding corresponding M/H Groups in the two CCC decoding apparatuses are supplied from one of those two CCC decoding apparatuses for subsequent decoding of TRS codewords in each of successive RS Frames.

U.S. patent application Ser. No. 12/928,186 filed by A. L. R. Limberg on 6 Dec. 2010 and titled "Broadcasting of concatenated-convolutional-coded data by one or more digital television transmitters for diversity reception" describes M/H receivers employing two CCC decoding apparatuses. The operations of the two CCC decoding apparatuses are not staggered in time, however. Rather, the two CCC decoding apparatuses are operated in parallel for decoding transmissions of the same M/H data from a plurality of DTV transmitters broadcasting via different RF channels, respectively, in a multiple-frequencynetwork (MFN) for frequency-diversity broadcasting of M/H data. The parallel operation of the two CCC decoding apparatuses facilitates the exchange of decoding information between the two CCC decoding apparatuses to improve decoding in each of them. The final results of decoding corresponding M/H Groups in the two CCC decoding apparatuses are supplied from one of those two CCC decoding apparatuses for subsequent decoding of TRS codewords in each of successive RS Frames.

It is indicated supra that each of the CCC decoding apparatuses depicted in FIG. 4, in FIG. 10, and in FIG. 13 is of a type for decoding SCCC at one-half or one-quarter the code rate of 8-VSB, presuming that the M/H transmissions are SCCC transmissions as prescribed by A/153. Each of these CCC decoding apparatuses can be of a type for decoding PCCC at one-half the code rate of 8-VSB if the M/H transmissions are PCCC transmissions instead. It is indicated supra that each of the CCC decoders depicted in FIG. 11, in FIG. 14, in FIG. 16 and in FIG. 17 is of a type for decoding SCCC at one-half or one-quarter the code rate of 8-VSB, presuming that the M/H transmissions are SCCC transmissions as prescribed by A/153. Each of these CCC decoders can be of a type for decoding PCCC at one-half the code rate of 8-VSB, presuming that the M/H transmissions are PCCC transmissions instead. PCCC transmissions of M/H data are described in US-2010-0100793-A1 and in U.S. patent application Ser. No. 12/928,186 filed 6 Dec. 2010. The U.S. patent application of A. L. R. Limberg titled "Burst-error correction methods and apparatuses for wireless digital communications systems" published 18 Nov. 2010 as US-2010-0293433-A1 describes PCCC transmissions of M/H data that utilize "coded" (or "implied") symbol interleaving of the outer convolutional coding. U.S. patent application Ser. No. 12/927,022 filed by A. L. R. Limberg on 4 Nov. 2010 and titled "Broadcasting of concatenated-convolutional-coded data by one or more digital television transmitters for diversity reception" describes decoders for Gray-labeled CCC data used in some embodiments of the invention.

It will be apparent to persons skilled in the art that various other modifications and variations can be made in the specifically described apparatus without departing from the spirit or scope of the invention. Accordingly, it is intended that these modifications and variations of the specifically described apparatus be considered to result in further embodiments of the invention, provided they come within the scope of the appended claims and their equivalents.

In the appended claims, the word "said" rather than the word "the" is used to indicate the existence of an antecedent basis for a term having being provided earlier in the claims. The word "the" is used for purposes other than to indicate the existence of an antecedent basis for a term having being provided earlier in the claims, the usage of the word "the" for other purposes being consistent with customary grammar in the American English language.

What is claimed is:

1. A receiver for concatenated convolutionally coded (CCC) transmissions of M/H-service data intended to be received and decoded by mobile and hand-held receivers collectively referred to as M/H receivers, said M/H-service data transversely Reed-Solomon-coded within RS Frames and subsequently encapsulated in 187-byte MHE packets time-division multiplexed with other 187-byte packets conveying trellis-coded main-service data within digital television (DTV) signals; said DTV signals being (207, 187) Reed-Solomon coded and convolutionally interleaved before being transmitted as 8-level vestigal-sideband amplitude-modulated (8-VSB) radio-frequency carrier waves; M/H Groups of said CCC transmissions of M/H-service data reposing in one or more of sixteen respective M/H Slots in each sub-Frame of each of a succession of consecutive M/H Frames; said sixteen respective M/H Slots in each successive sub-Frame considered as being consecutively numbered #0, #1, #2, #3, #4, #5, #6, #7, #8, #9, #10, #11, #12, #13, #14, #15 in the order in which they occur for transmission; said receiver being an M/H receiver comprising:

a tuner for receiving a selected one of 8-VSB DTV signals broadcast at radio frequencies and converting it to a baseband DTV signal comprising said M/H Groups of said CCC transmissions of M/H-service data in ones of said M/H Slots superposed on successive data fields of convolutionally byte-interleaved 207-byte data segments;

a plurality of CCC decoding apparatuses each connected for decoding selected ones of said M/H Groups of CCC transmissions of M/H-service data contained in respective sets of M/H Slots in each successive M/H sub-Frame in said baseband DTV signal, thereby to produce respective sets of CCC decoding results descriptive of transversely Reed-Solomon-coded M/H-service data, none of said plurality of CCC decoding apparatuses decoding Groups of said CCC transmissions of M/H-service data contained in temporally consecutive M/H Slots in said baseband DTV signal;

a decoder for Reed-Solomon forward-error-correction coding of a type used for transversely Reed-Solomon coding M/H-service data within each of said RS Frames, said decoder for Reed-Solomon forward-error-correction coding having an input port for receiving codewords of said transversely Reed-Solomon coding M/H-service data as received subject to having byte errors incurred during transmission, and said decoder for Reed-Solomon forward-error-correction coding having an input port for supplying at least selected portions of said codewords of said transversely Reed-Solomon coding M/H-service data after correction of said byte errors; and byte-organized memory for temporarily storing received RS Frames of transversely Reed-Solomon-coded M/H-service data, said byte-organized memory operable to have sections of byte-storage locations therewithin written row-by-row by a write input signal generated by time-division multiplexing said respective sets of CCC decoding results descriptive of transversely Reed-Solomon-coded M/H-service data, said byte-organized memory further operable to have said byte-storage locations therewithin read column-by-column for supplying codewords of transversely Reed-Solomon coding M/H-service data to said input port of said decoder for Reed-Solomon forward-error-correction coding.

2. A receiver as set forth in claim 1, wherein none of said plurality of CCC decoding apparatuses decodes said CCC transmissions of M/H-service data contained in any other but its said respective set of M/H Slots in each successive M/H sub-Frame in said baseband DTV signal.

3. A receiver as set forth in claim 2, wherein said plurality of CCC decoding apparatuses comprises:
- a first CCC decoding apparatus for decoding M/H Groups of CCC conveyed within any of said M/H Slots #0, #2, #4, #6, #8, #10, #12 and #14; and
- a second CCC decoding apparatus for decoding M/H Groups of CCC conveyed within any of said M/H Slots #1, #3, #5, #7, #9, #11, #13 and #15.

4. A receiver as set forth in claim 2, wherein said plurality of CCC decoding apparatuses comprises:
- a first CCC decoding apparatus for decoding M/H Groups of CCC conveyed within any of said M/H Slots #0, #3, #6, #9, #12 and #15;
- a second CCC decoding apparatus for decoding M/H Groups of CCC conveyed within any of said M/H Slots #1, #4, #7, #10 and #13; and
- a third CCC decoding apparatus for decoding M/H Groups of CCC conveyed within any of said M/H Slots #2, #5, #8, #11 and #14.

5. A receiver as set forth in claim 2, wherein said plurality of CCC decoding apparatuses comprises:
- a first CCC decoding apparatus for decoding M/H Groups of CCC conveyed within any of said M/H Slots #0, #4, #8 and #12;
- a second CCC decoding apparatus for decoding M/H Groups of CCC conveyed within any of said M/H Slots #1, #5, #9 and #13;
- a third CCC decoding apparatus for decoding M/H Groups of CCC conveyed within any of said M/H Slots #2, #6, #10 and #14; and
- a fourth CCC decoding apparatus for decoding M/H Groups of CCC conveyed within any of said M/H Slots #3, #7, #11 and #15.

6. A receiver as set forth in claim 2, wherein said plurality of CCC decoding apparatuses comprises:
- a first CCC decoding apparatus for decoding M/H Groups of CCC conveyed within any of said M/H Slots #0, #5, #10 and #15;
- a second CCC decoding apparatus for decoding M/H Groups of CCC conveyed within any of said M/H Slots #1, #6 and #11;
- a third CCC decoding apparatus for decoding M/H Groups of CCC conveyed within any of said M/H Slots #2, #7 and #12;
- a fourth CCC decoding apparatus for decoding M/H Groups of CCC conveyed within any of said M/H Slots #3, #8 and #13; and
- a fifth CCC decoding apparatus for decoding M/H Groups of CCC conveyed within any of said M/H Slots #4, #9 and #14.

7. A receiver as set forth in claim 2, wherein said plurality of CCC decoding apparatuses comprises:
- a first CCC decoding apparatus for decoding M/H Groups of CCC conveyed within any of said M/H Slots #0, #6 and #12;
- a second CCC decoding apparatus for decoding M/H Groups of CCC conveyed within any of said M/H Slots #1, #7 and #13;
- a third CCC decoding apparatus for decoding M/H Groups of CCC conveyed within any of said M/H Slots #2, #8 and #14;
- a fourth CCC decoding apparatus for decoding M/H Groups of CCC conveyed within any of said M/H Slots #3, #9 and #15;
- a fifth CCC decoding apparatus for decoding M/H Groups of CCC conveyed within either of said M/H Slots #4 and #10; and
- a sixth CCC decoding apparatus for decoding M/H Groups of CCC conveyed within either of said M/H Slots #5 and #11.

8. A receiver as set forth in claim 2, wherein said plurality of CCC decoding apparatuses comprises:
- a first CCC decoding apparatus for decoding M/H Groups of CCC conveyed within any of said M/H Slots #0, #7 and #14;
- a second CCC decoding apparatus for decoding M/H Groups of CCC conveyed within any of said M/H Slots #1, #8 and #15;
- a third CCC decoding apparatus for decoding M/H Groups of CCC conveyed within either of said M/H Slots #2 and #9;
- a fourth CCC decoding apparatus for decoding M/H Groups of CCC conveyed within either of said M/H Slots #3 and #10;
- a fifth CCC decoding apparatus for decoding M/H Groups of CCC conveyed within either of said M/H Slots #4 and #11;
- a sixth CCC decoding apparatus for decoding M/H Groups of CCC conveyed within either of said M/H Slots #5 and #12; and
- a seventh CCC decoding apparatus for decoding M/H Groups of CCC conveyed within either of said M/H Slots #6 and #13.

9. A receiver as set forth in claim 2, wherein said plurality of CCC decoding apparatuses comprises:
- a first CCC decoding apparatus for decoding M/H Groups of CCC conveyed within either of said M/H Slots #0 and #8;
- a second CCC decoding apparatus for decoding M/H Groups of CCC conveyed within either of said M/H Slots #1 and #9;
- a third CCC decoding apparatus for decoding M/H Groups of CCC conveyed within either of said M/H Slots #2 and #10;
- a fourth CCC decoding apparatus for decoding M/H Groups of CCC conveyed within either of said M/H Slots #3 and #11;
- a fifth CCC decoding apparatus for decoding M/H Groups of CCC conveyed within either of said M/H Slots #4 and #12;
- a sixth CCC decoding apparatus for decoding M/H Groups of CCC conveyed within either of said M/H Slots #5 and #13;

a seventh CCC decoding apparatus for decoding M/H Groups of CCC conveyed within either of said M/H Slots #6 and #14; and an eighth CCC decoding apparatus for decoding M/H Groups of CCC conveyed within either of said M/H Slots #7 and #15.

* * * * *